(12) United States Patent
Venkatasubramanian et al.

(10) Patent No.: US 11,289,756 B2
(45) Date of Patent: Mar. 29, 2022

(54) ACTIVE THERMAL MANAGEMENT OF BATTERY CELLS VIA THERMOELECTRICS

(71) Applicant: The Johns Hopkins University, Baltimore, MD (US)

(72) Inventors: Rama Venkatasubramanian, Cary, NC (US); Geza Dezsi, Durham, NC (US)

(73) Assignee: The Johns Hopkins University, Baltimore, MD (US)

( * ) Notice: Subject to any disclaimer, the term of this patent is extended or adjusted under 35 U.S.C. 154(b) by 261 days.

(21) Appl. No.: 16/413,750

(22) Filed: May 16, 2019

(65) Prior Publication Data

US 2019/0356030 A1 Nov. 21, 2019

Related U.S. Application Data

(60) Provisional application No. 62/673,566, filed on May 18, 2018.

(51) Int. Cl.
| | |
|---|---|
| *H01M 10/6572* | (2014.01) |
| *H01L 35/30* | (2006.01) |
| *H01L 23/38* | (2006.01) |
| *H01L 35/08* | (2006.01) |
| *H01L 35/04* | (2006.01) |
| *H01L 35/32* | (2006.01) |

(52) U.S. Cl.
CPC ........ *H01M 10/6572* (2015.04); *H01L 23/38* (2013.01); *H01L 35/08* (2013.01); *H01L 35/30* (2013.01); *H01L 35/04* (2013.01); *H01L 35/32* (2013.01)

(58) Field of Classification Search
CPC .................................................. H01M 10/6572
See application file for complete search history.

(56) References Cited

U.S. PATENT DOCUMENTS

| | | | |
|---|---|---|---|
| 5,229,327 A * | 7/1993 | Farnworth | H01L 23/38 |
| | | | 257/E23.082 |
| 9,584,061 B1 * | 2/2017 | Dede | H02M 1/32 |
| 2003/0064283 A1 * | 4/2003 | Uemoto | H01M 50/60 |
| | | | 429/149 |

(Continued)

OTHER PUBLICATIONS

F. Leng, et al., "Effect of Temperature on the Aging rate of Li Ion Battery Operating above Room Temperature," Scientific Reports 5:12967, DOI: 10.1038/srep1296706, Aug. 2015, pp. 1-12.

*Primary Examiner* — Eli S Mekhlin
(74) *Attorney, Agent, or Firm* — Noah J. Hayward

(57) ABSTRACT

An apparatus includes an anode of a cell for a battery, a cathode of the cell, an anode thermoelectric device, and a cathode thermoelectric device. The anode thermoelectric device may be operably coupled to the anode of the cell, and the anode thermoelectric device may be connected in electrical series with the anode of the cell. The cathode thermoelectric device may be operably coupled to the cathode of the cell, and the cathode thermoelectric device being connected in electrical series with the cathode of the cell. The cathode thermoelectric device and the anode thermoelectric device may operate as a heat pump system configured to remove heat from the cathode and provide heat to the anode in response to the cell being discharged, and remove heat from the anode and provide heat to the cathode in response to the cell being charged.

20 Claims, 20 Drawing Sheets

(56) References Cited

U.S. PATENT DOCUMENTS

2006/0225773 A1* 10/2006 Venkatasubramanian ................... B82Y 10/00
136/205
2018/0138106 A1 5/2018 Venkatasubramanian et al.

* cited by examiner

ACTIVE THERMAL MANAGEMENT OF BATTERY CELLS VIA THERMOELECTRICS

CROSS-REFERENCE TO RELATED APPLICATIONS

This application claims priority to and the benefit of prior-filed, U.S. provisional application Ser. No. 62/673,566 filed on May 18, 2018, the entire content of which is hereby incorporated herein by reference.

BACKGROUND

Example embodiments generally relate to battery thermal management and, more particularly, relate to battery temperature management via thermoelectrics.

In general, batteries, and in particular Lithium-ion (Li-ion) batteries, are a preferred energy storage and power delivery source for a wide range of applications, including, for example, uninterrupted power supplies (UPS), electric vehicles (EV), computers, satellites and smart phones. All such equipment and technologies demand efficient stored energy use, high spatial power density (as in watts/cm' or watts/cc), fast discharge and recharge, and battery temperature management.

An issue that exists with batteries is heat and the management of heat generated by cells in the battery. Conventional systems rely upon numerous techniques to expel heat from cells (i.e., cells of a battery, also referred to as battery cells) that are supplying energy to a load or are being charged. Some examples of such techniques are heat sinks, fans, liquid coolant systems, and the like. While these solutions can be effective to a small degree, such solutions add substantial cost, weight, and complexity to the battery systems. Additionally, such conventional solutions can substantially add to the load on the batteries, thereby reducing the efficiency of the overall battery system.

As such, improvements in the area of battery heat management continue to be needed, particularly due to the vast and increasing number of applications for mobile power sources based on Li-ion batteries.

BRIEF SUMMARY

An apparatus according to non-limiting, example embodiments of the inventions described herein includes an anode of a cell for a battery, a cathode of the cell, an anode thermoelectric device, and a cathode thermoelectric device. The anode thermoelectric device may be operably coupled to the anode of the cell, and the anode thermoelectric device may be connected in electrical series with the anode of the cell. The cathode thermoelectric device may be operably coupled to the cathode of the cell, and the cathode thermoelectric device being connected in electrical series with the cathode of the cell. The cathode thermoelectric device and the anode thermoelectric device may operate as a heat pump system configured to remove heat from the cathode and provide heat to the anode in response to the cell being discharged, and remove heat from the anode and provide heat to the cathode in response to the cell being charged.

According to other example embodiments, a cell is provided. The cell includes a casing, an anode disposed within the casing, a cathode disposed within the casing, an electrolyte disposed within the casing, a separator disposed within the casing, an anode thermoelectric device disposed within the casing and electrically connected, such as in electrical series, with the anode, and a cathode thermoelectric device disposed within the casing and similarly connected with the cathode. The separator may be formed of a porous material that permits passage of ions between the anode to the cathode. The cell may also include a negative terminal connected to the anode thermoelectric device and a positive terminal connected to the cathode thermoelectric device. The negative terminal may include a negative terminal portion that is external to the casing, and the positive terminal may include a positive terminal portion that is external to the casing.

According to yet other example embodiments, an apparatus is provided that includes an anode of a cell, a cathode of the cell, and a thermoelectric device operably coupled to the anode or the cathode of the cell. The thermoelectric device may be electrically connected, such as in series, with the anode or the cathode of the cell, and the thermoelectric device may include p-type thermoelectric semiconductor elements electrically connected (e.g., in parallel) and thermally coupled (in parallel, as well, for example).

BRIEF DESCRIPTION OF THE SEVERAL VIEWS OF THE DRAWINGS

Figure 1:
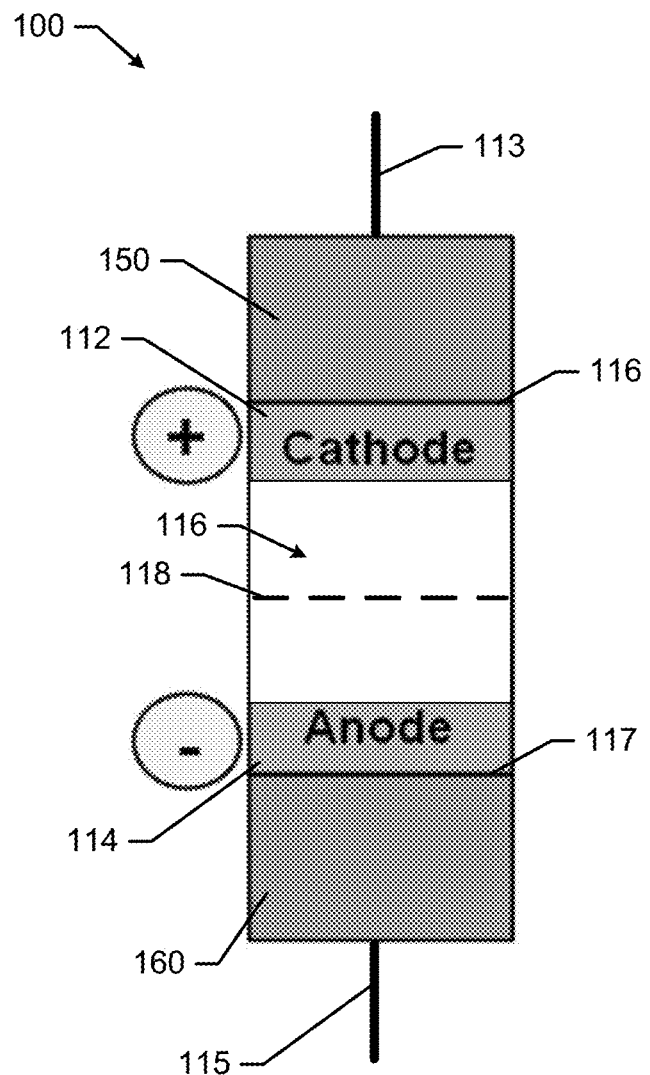
Figure 2:
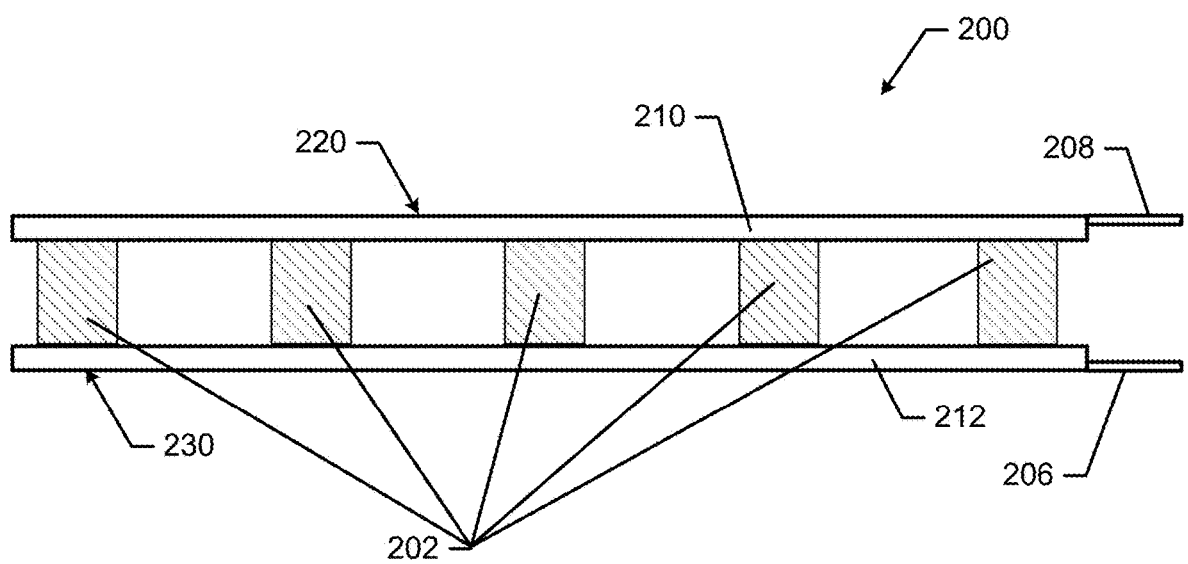
Figure 3A:
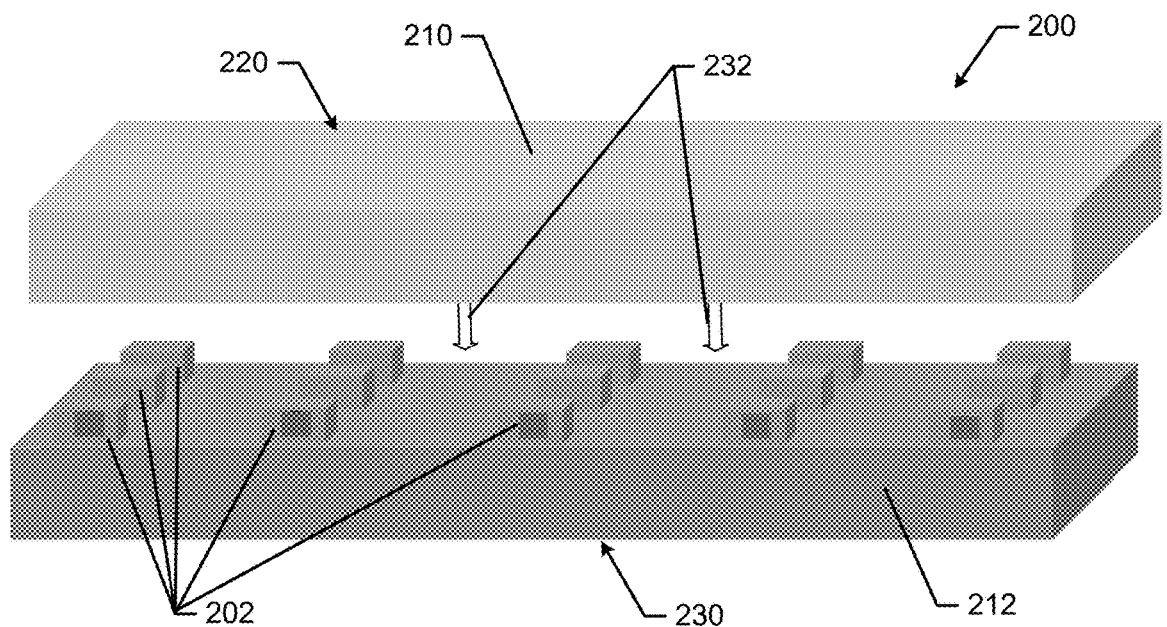
Figure 3B:
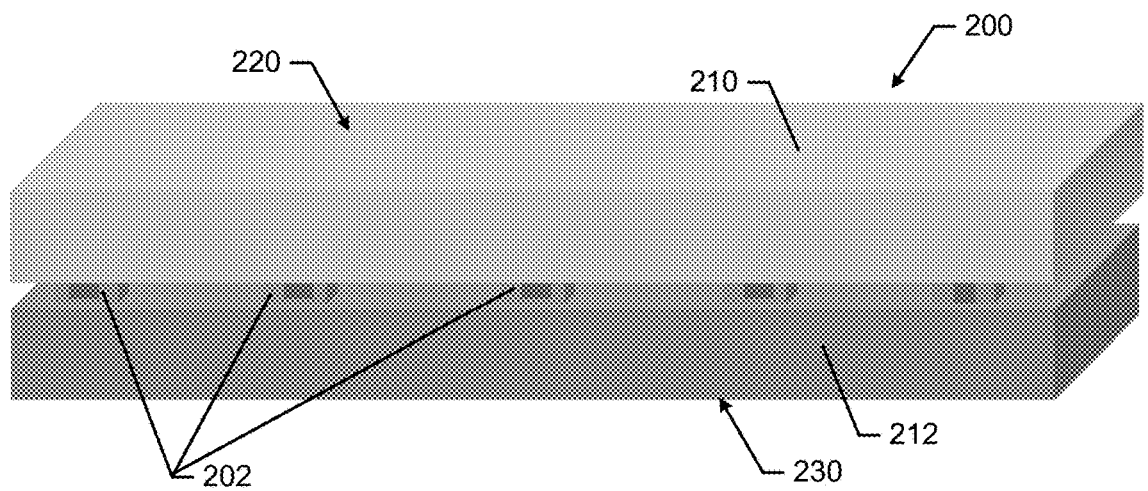
Figure 4:
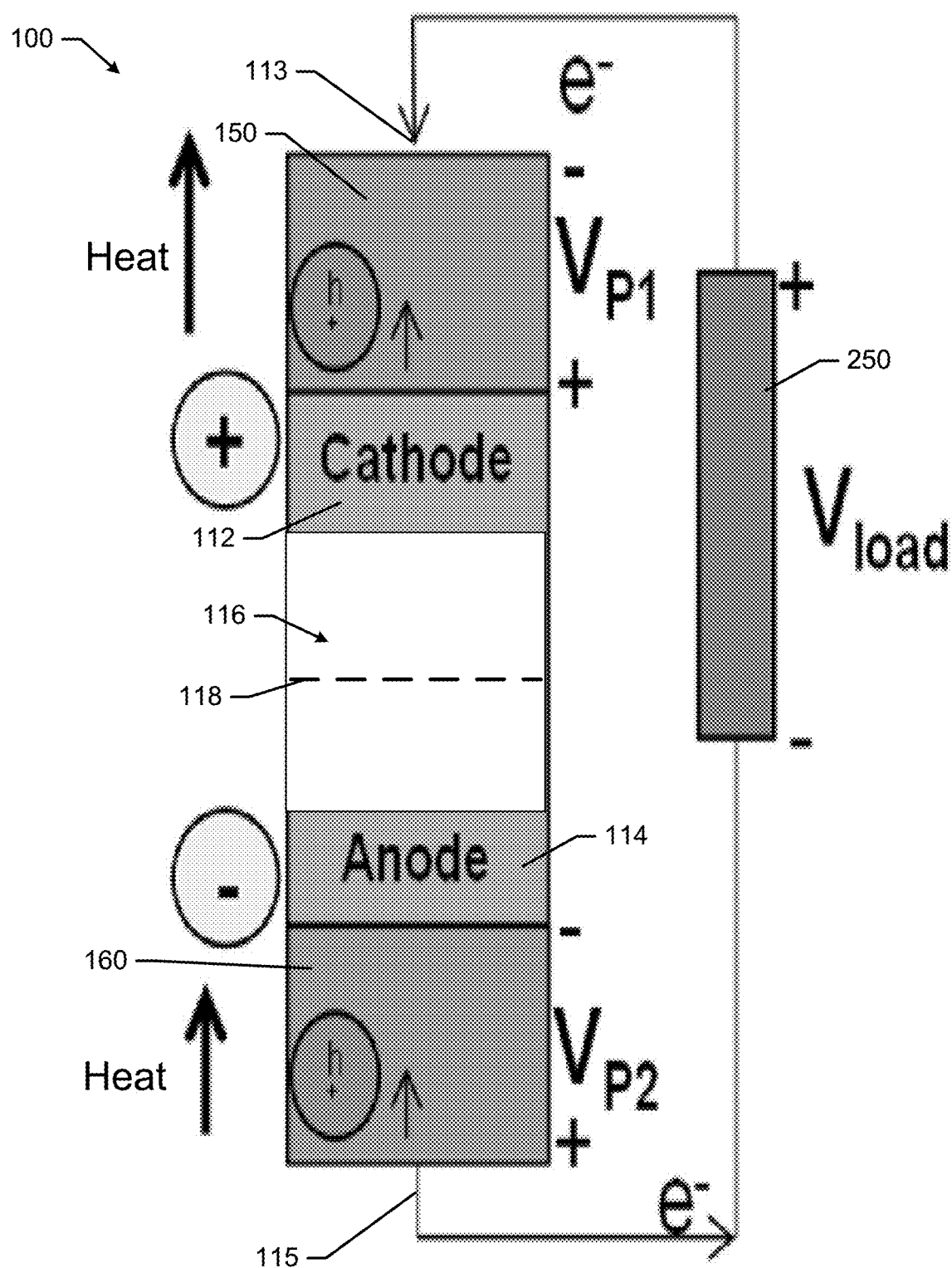
Figure 5:
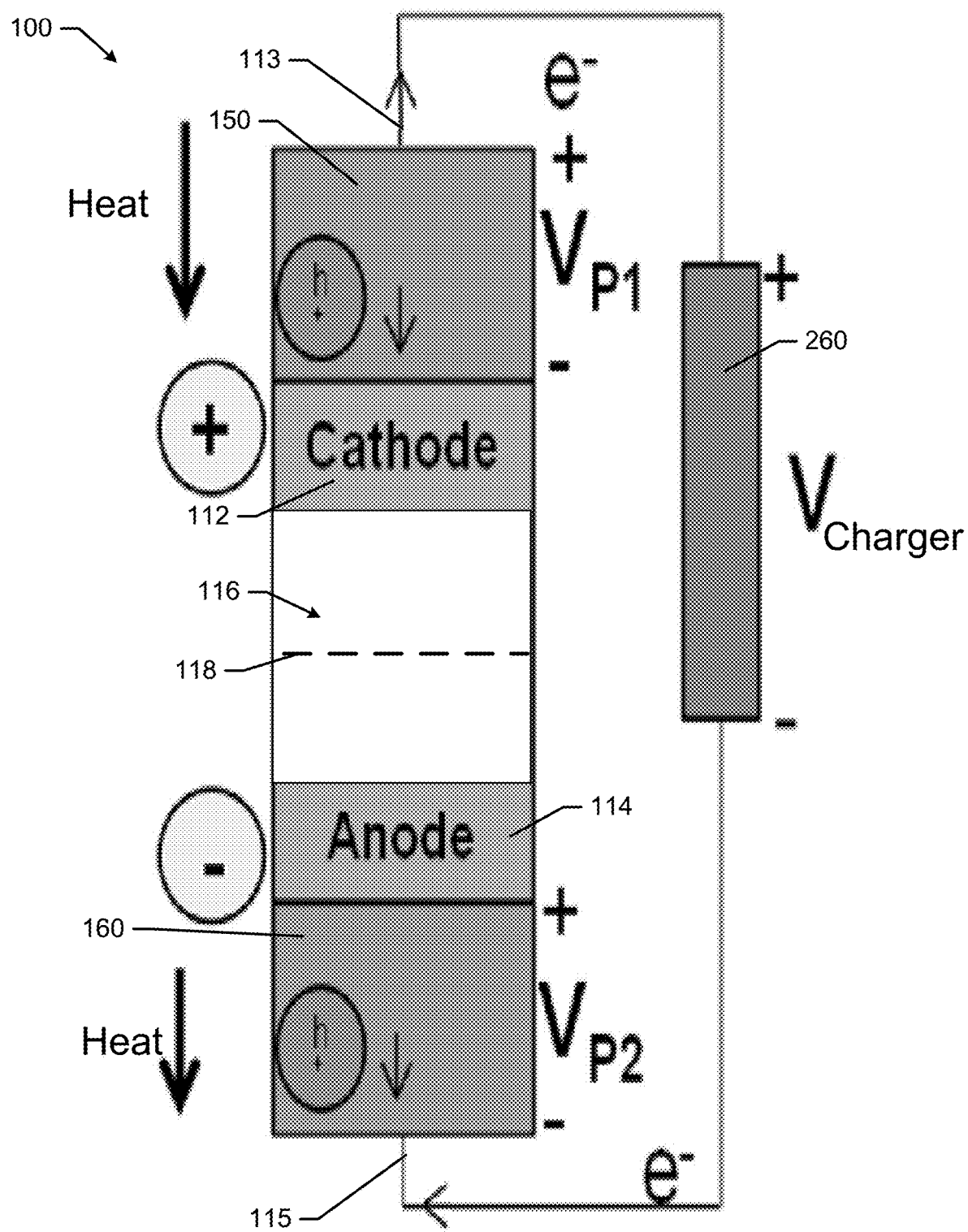
Figure 6:
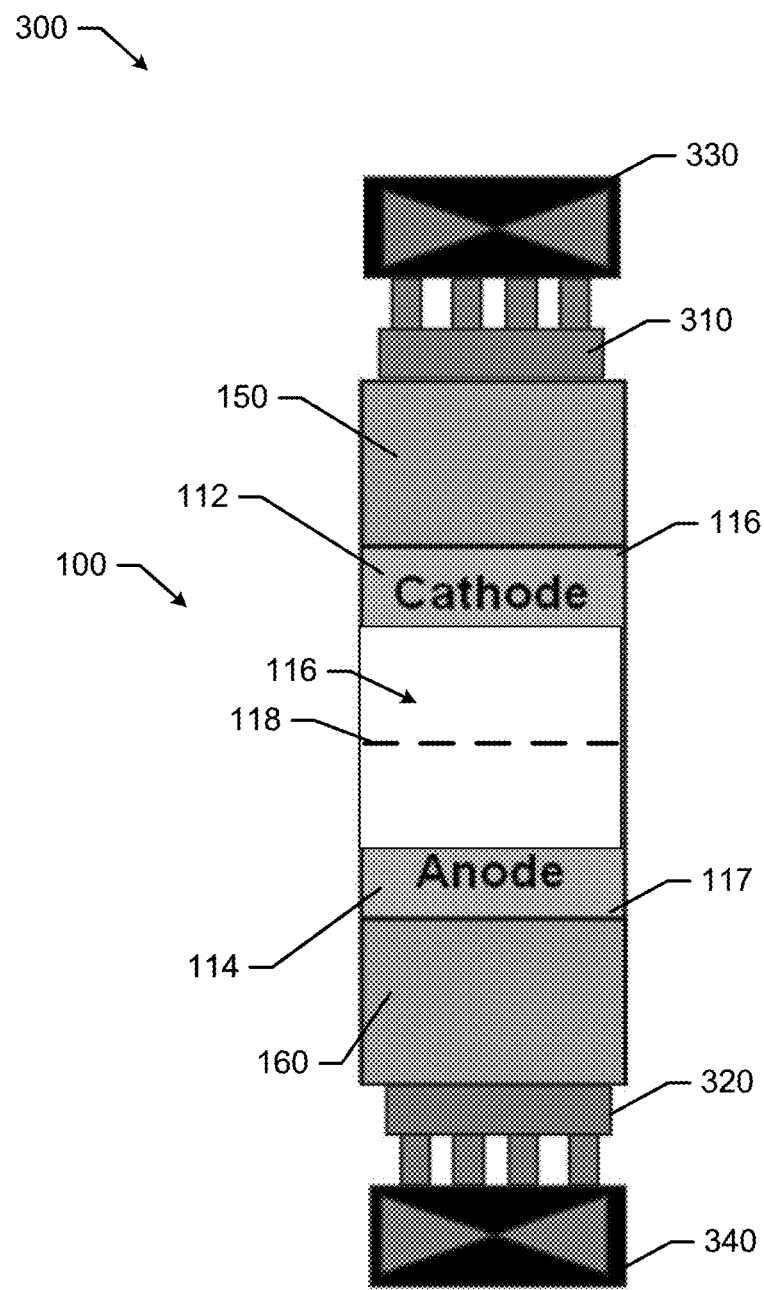
Figure 7:
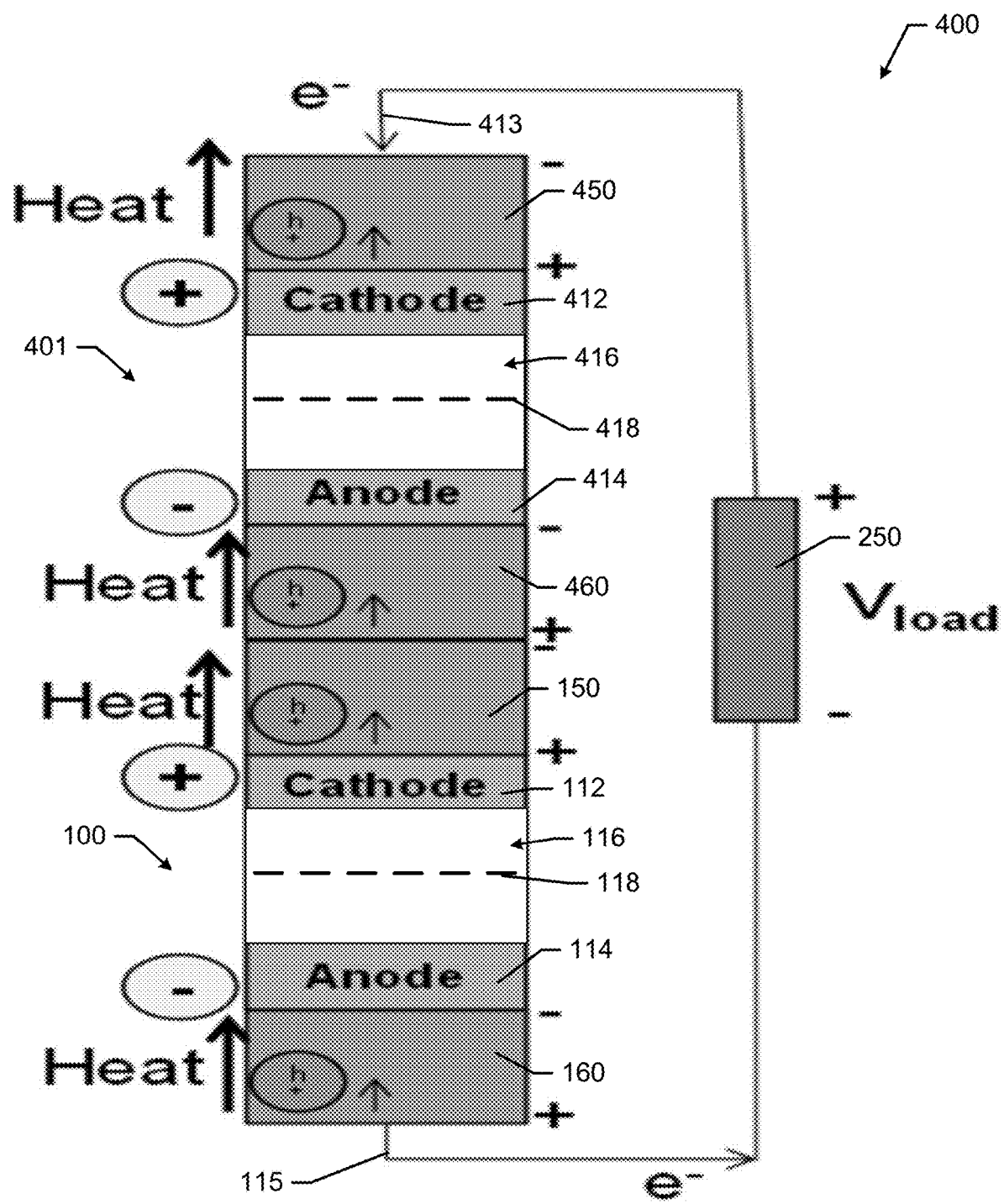
Figure 8:
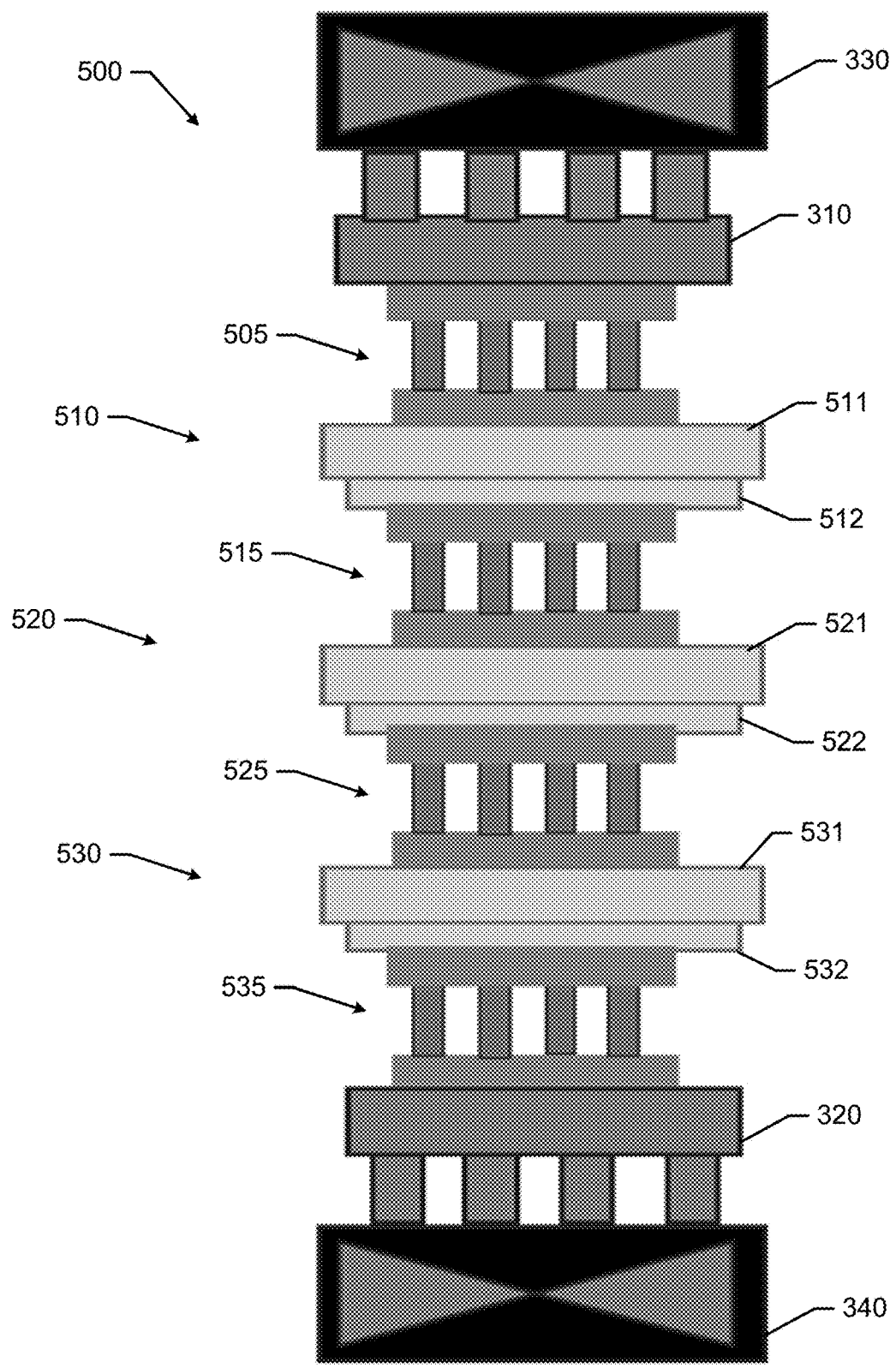
Figure 9:
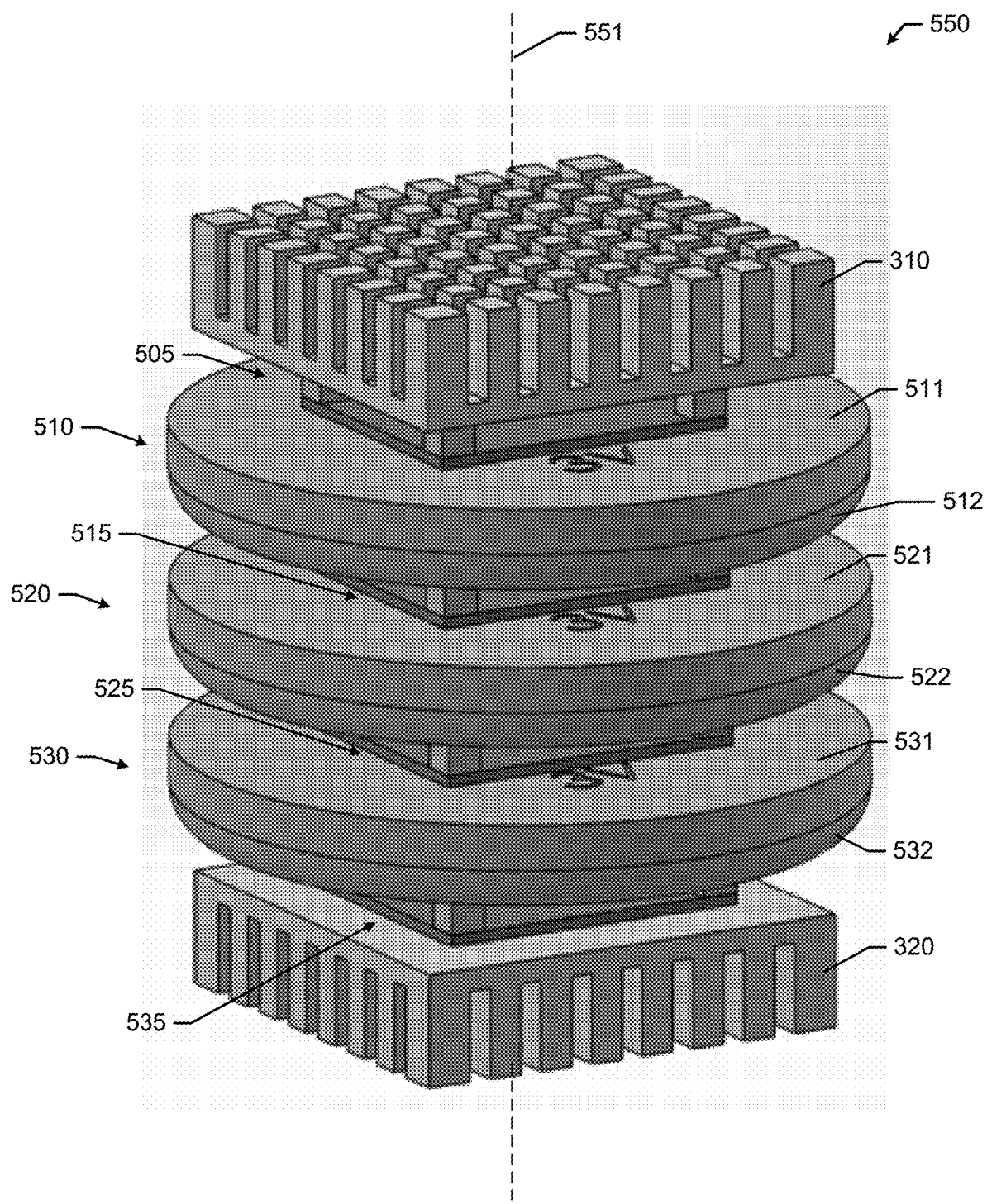
Figure 10:
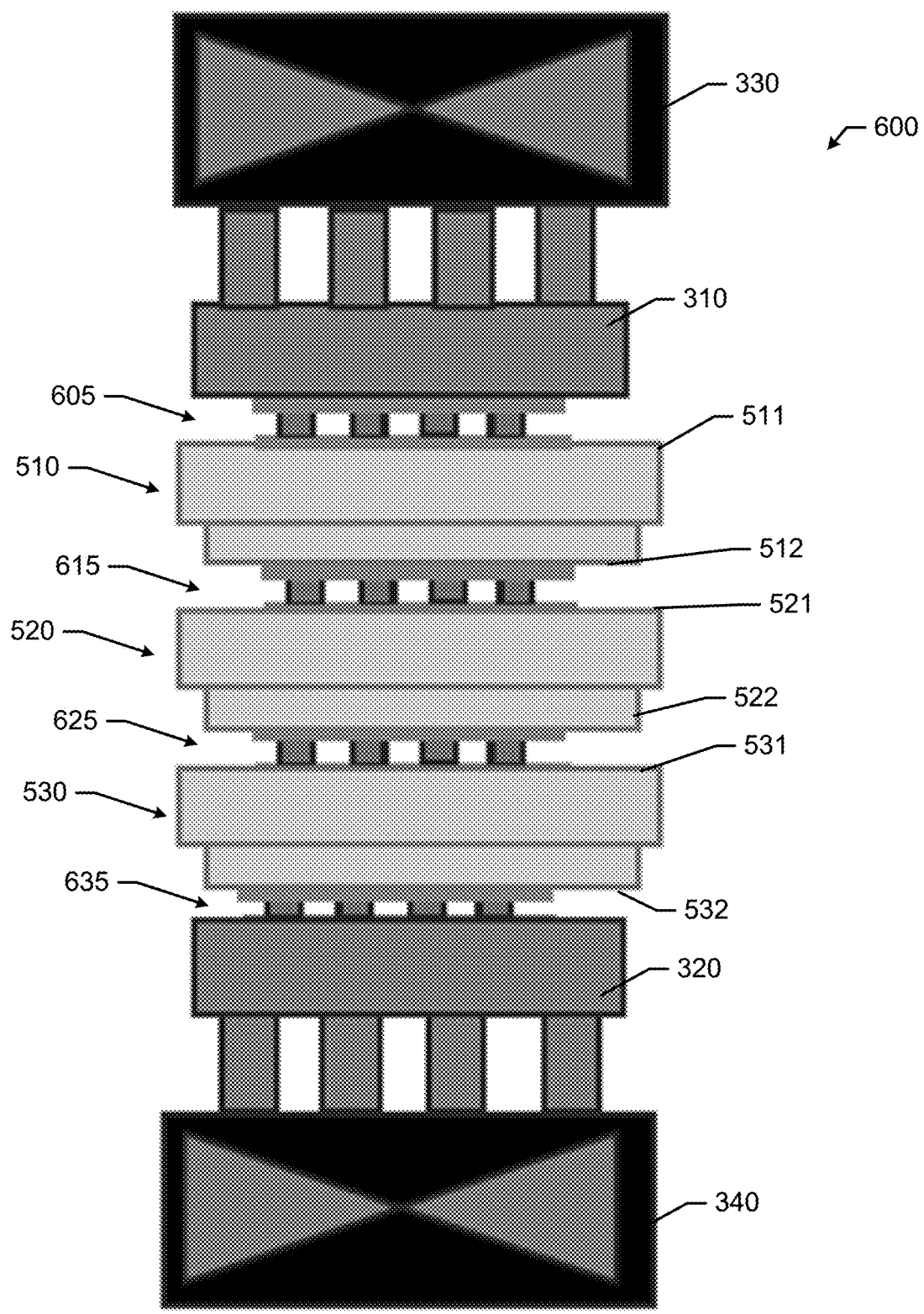
Figure 11:
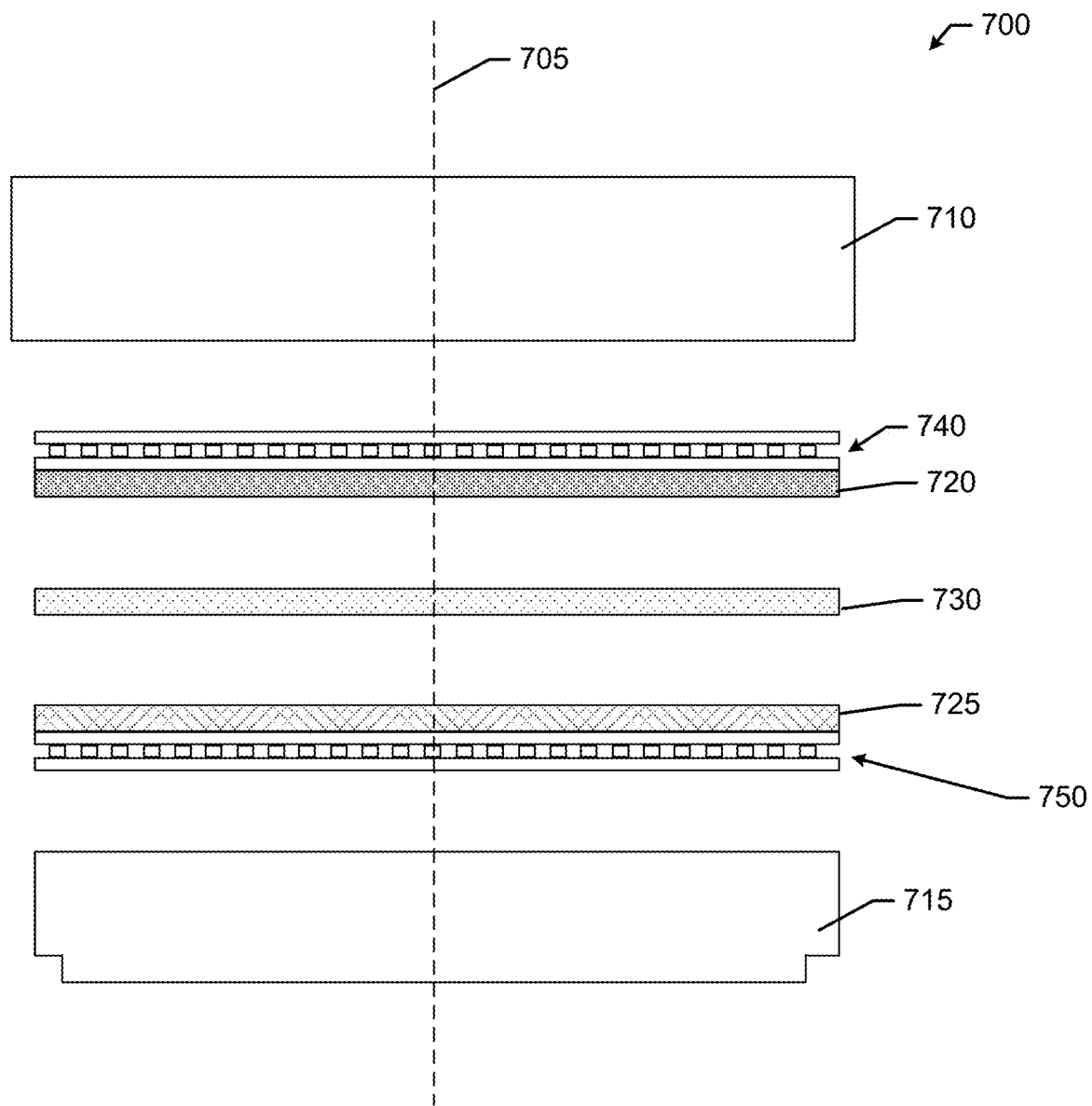
Figure 12:
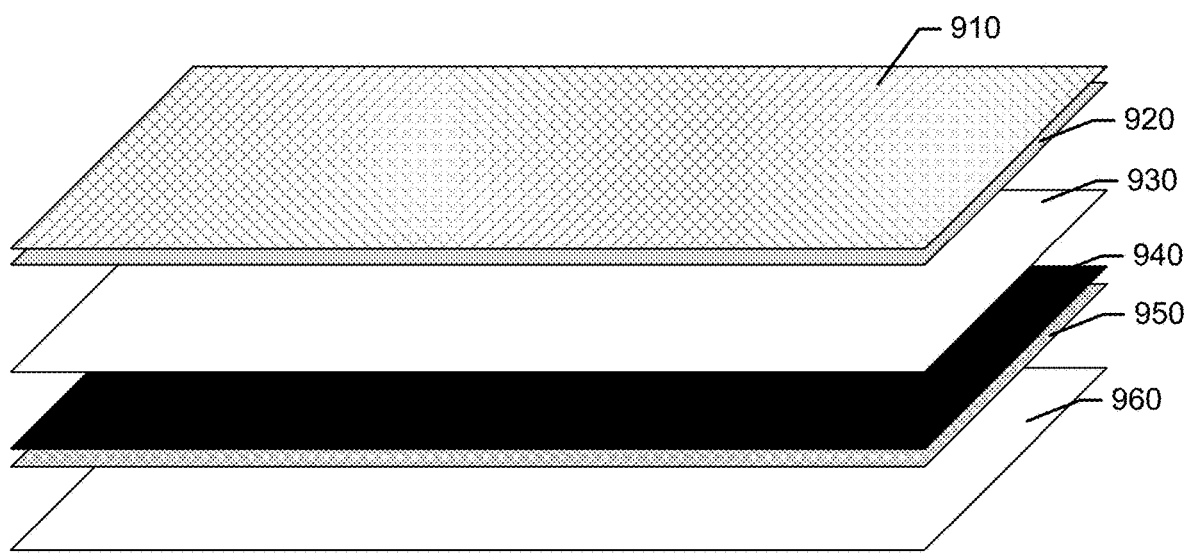
Figure 13:
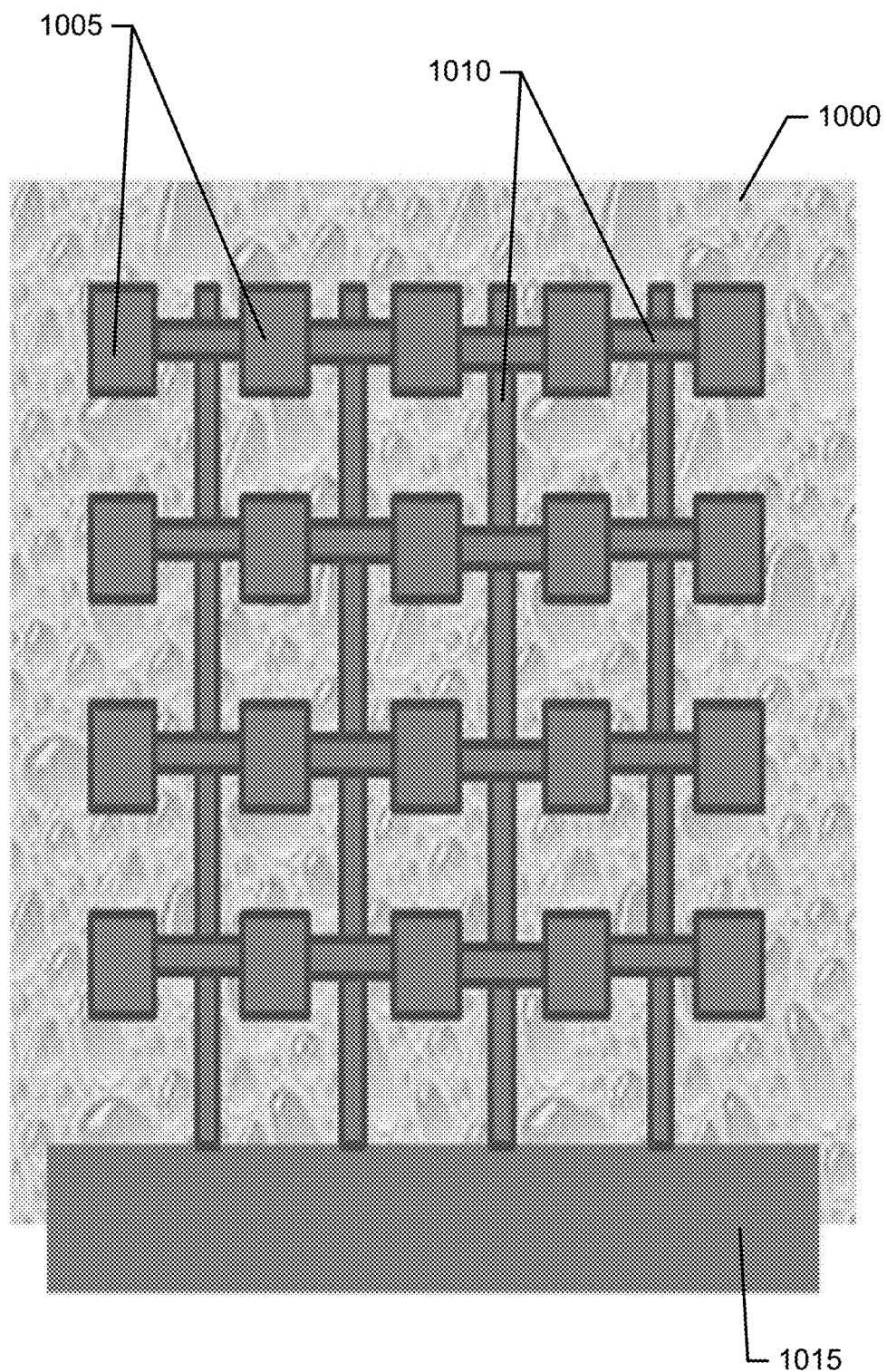
Figure 14:
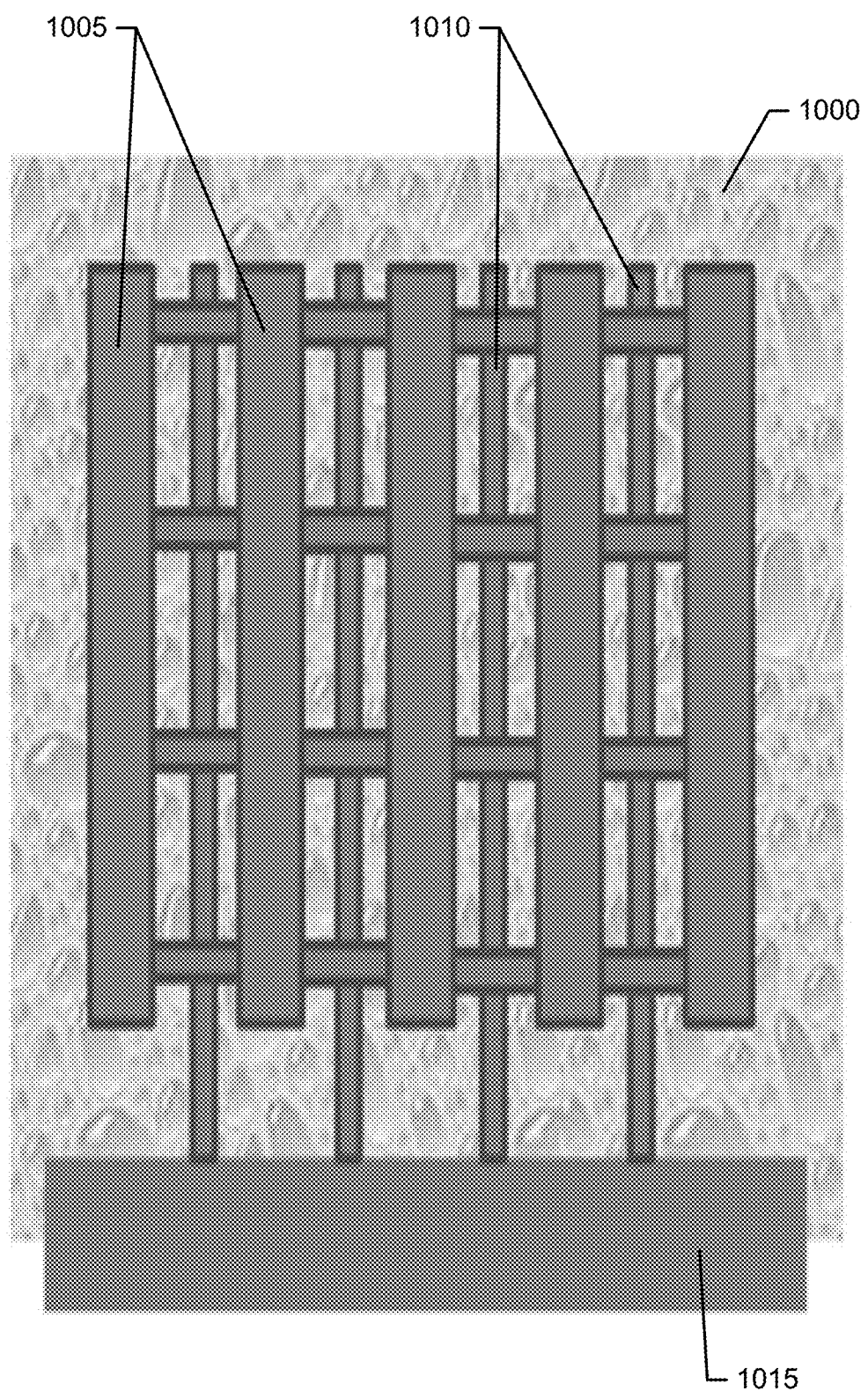
Figure 15:
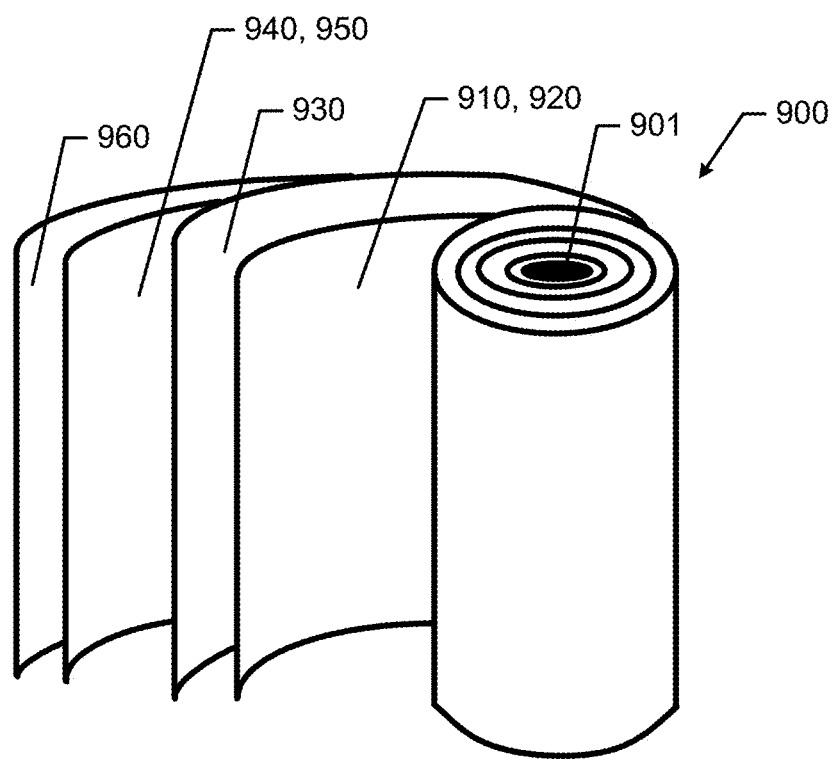
Figure 16:
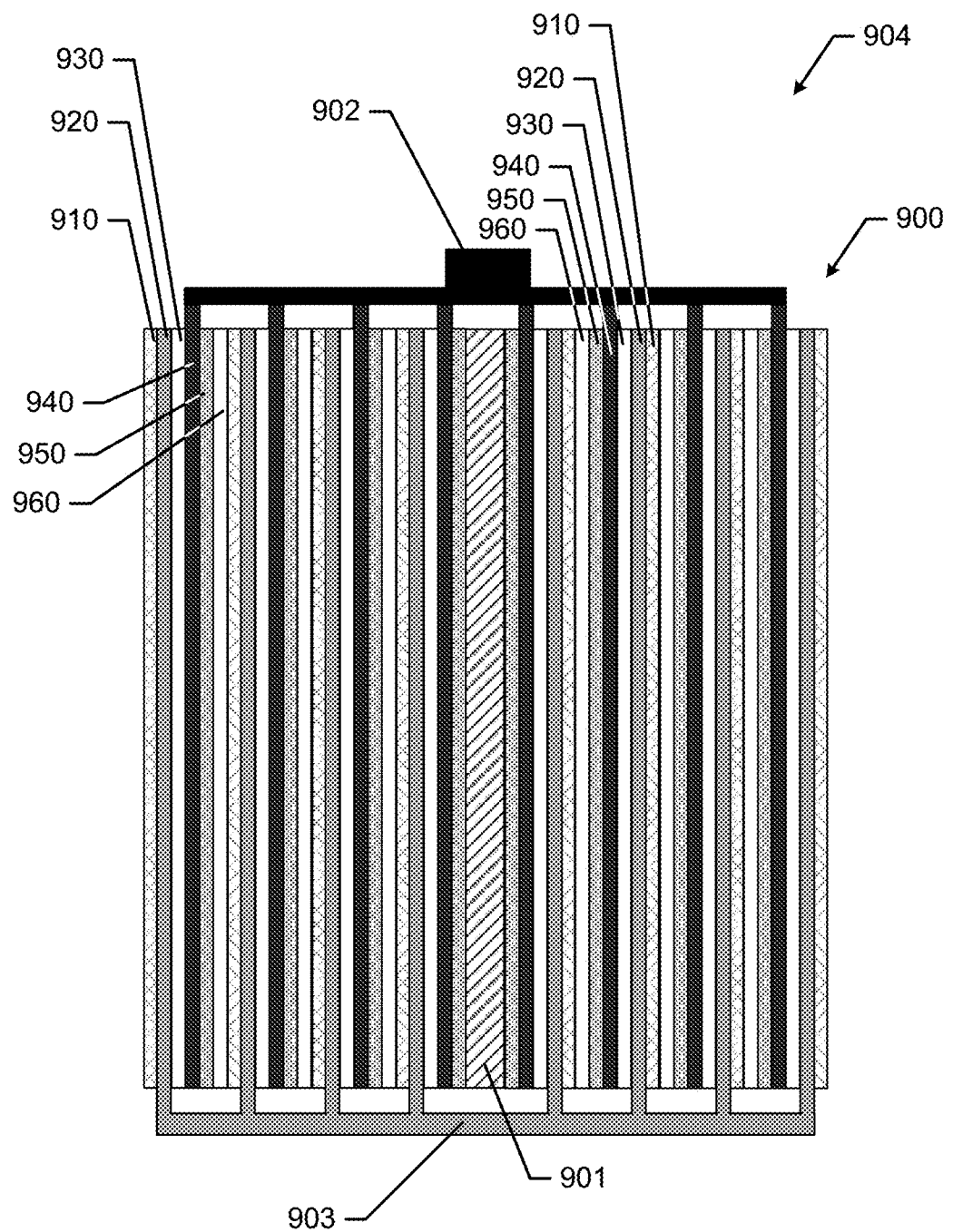
Figure 17:
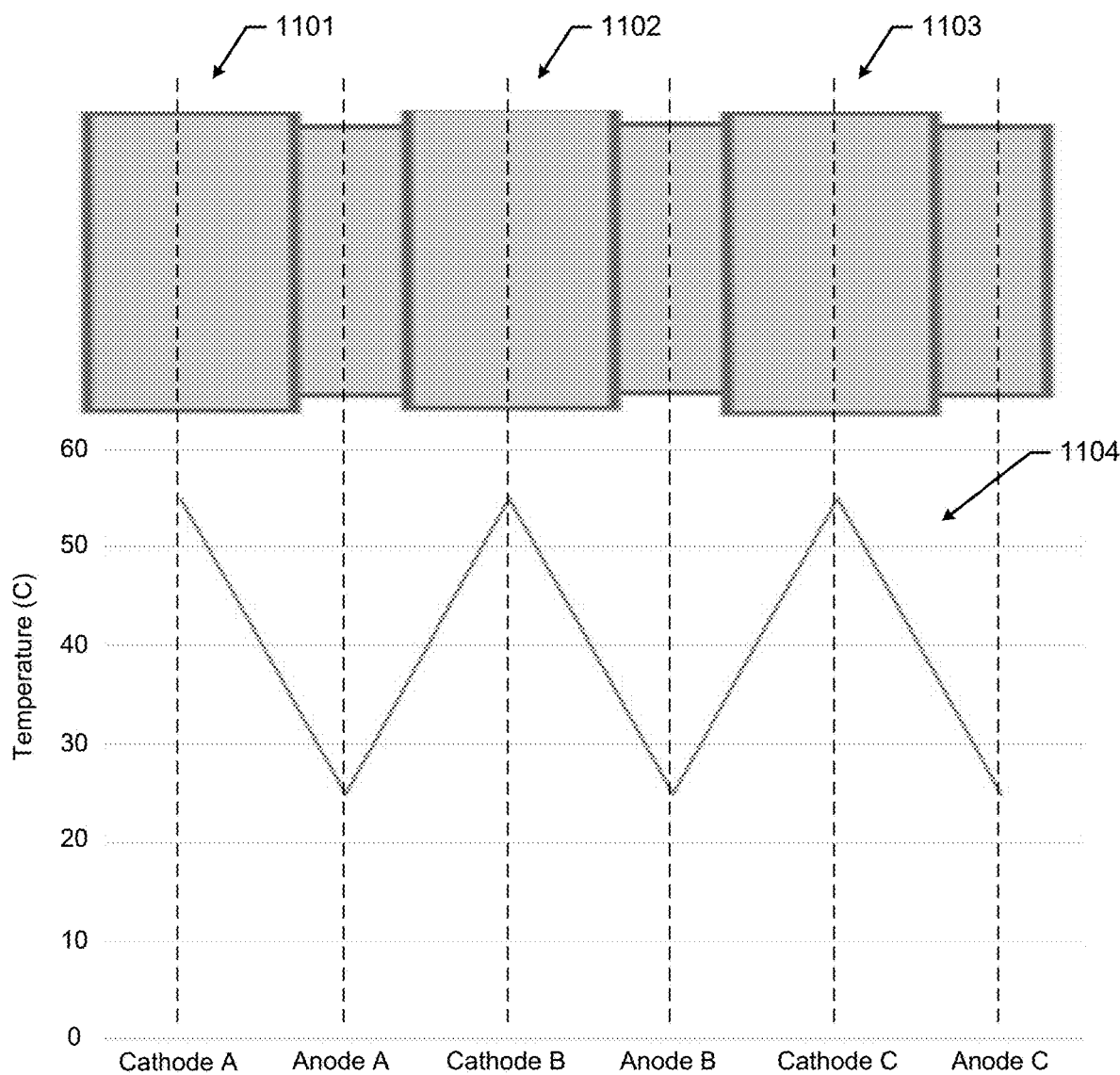
Figure 18:
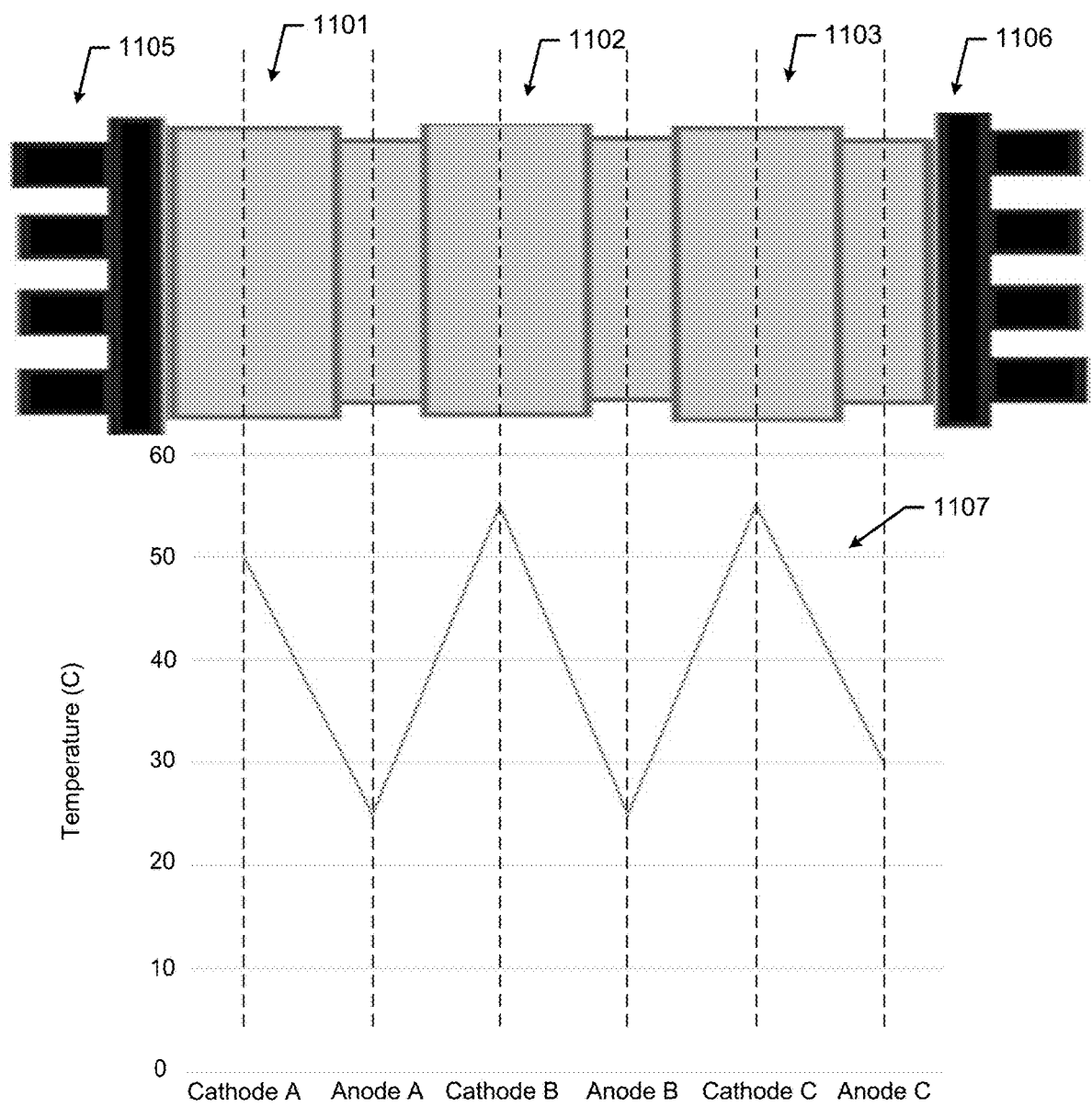
Figure 19:
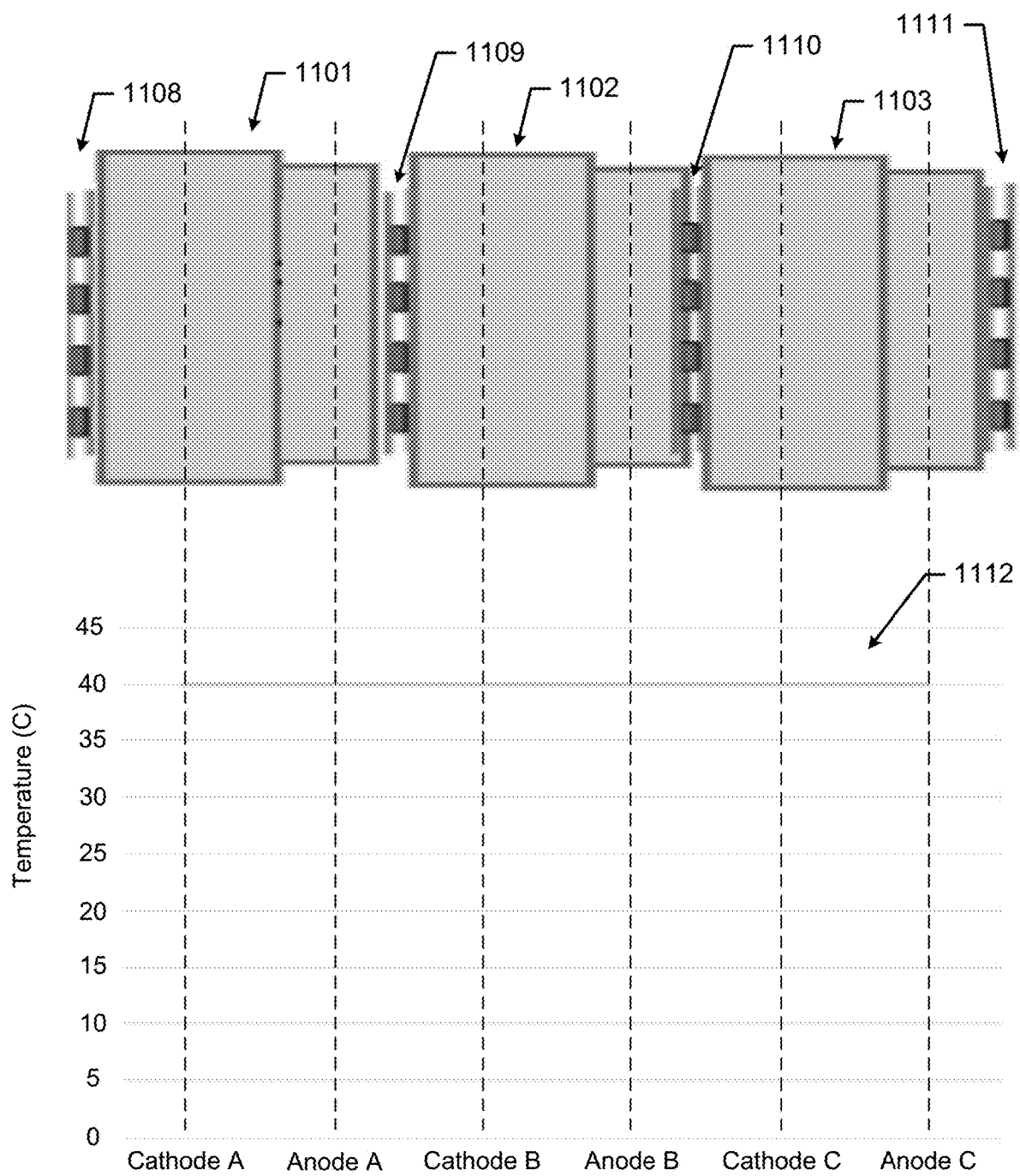
Figure 20:
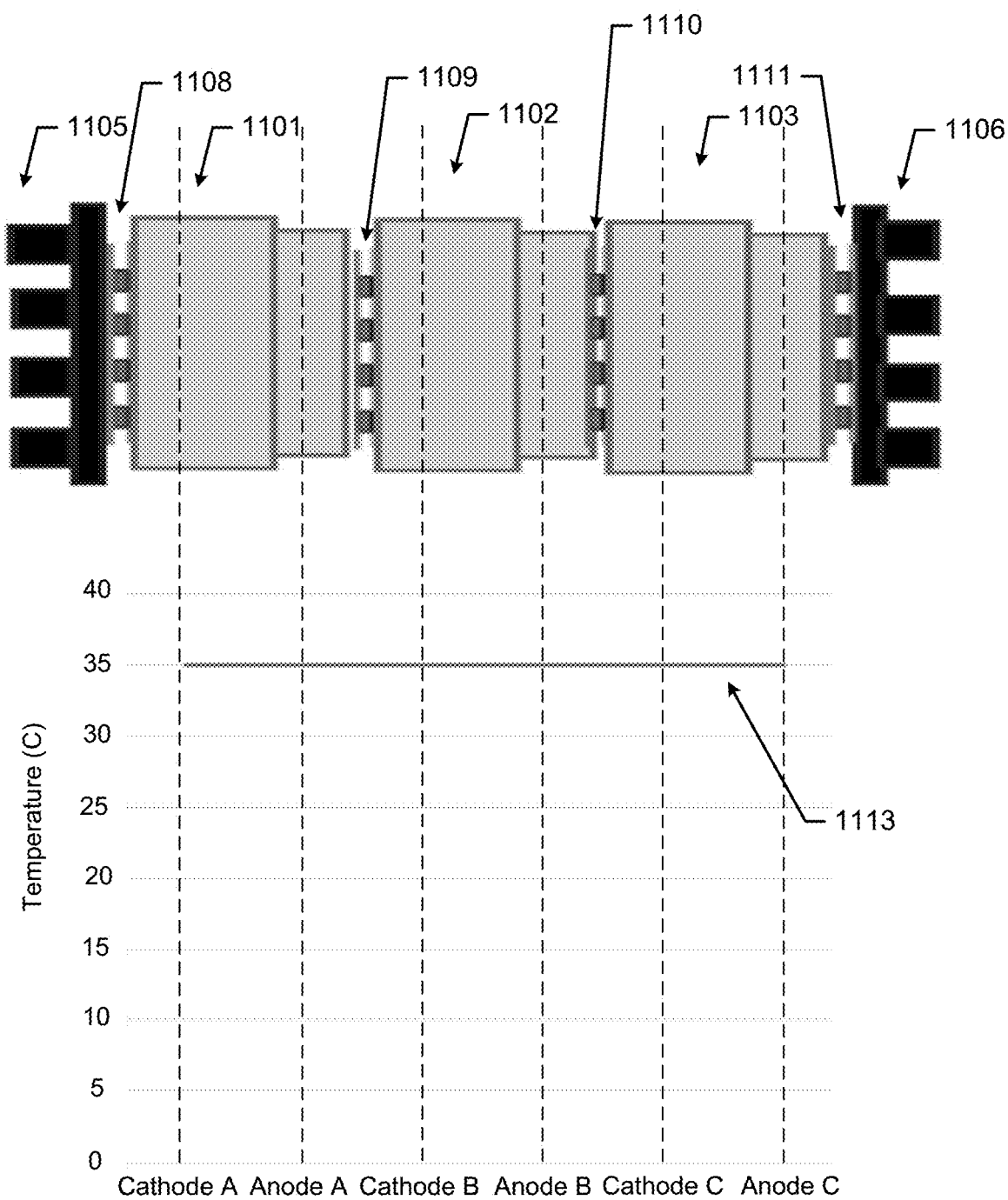

Having thus described some example embodiments in general terms, reference will now be made to the accompanying drawings, which are not necessarily drawn to scale, and wherein:

FIG. 1 shows a cell of a battery comprising thermoelectric devices for thermal management according to some example embodiments;

FIG. 2 shows a side view of a thermoelectric device according to some example embodiments;

FIG. 3A shows an exploded perspective view of a thermoelectric device according to some example embodiments;

FIG. 3B shows an assembled perspective view of a thermoelectric device according to some example embodiments;

FIG. 4 shows a cell of a battery discharging to provide energy to a load according to some example embodiments;

FIG. 5 shows a cell of a battery being charged by a charger according to some example embodiments;

FIG. 6 shows a cell of a battery including additional thermal management devices according to some example embodiments;

FIG. 7 shows a battery system having two series connected cells comprising thermoelectric devices for thermal management according to some example embodiments;

FIG. 8 shows a battery system having three series connected cells comprising thermoelectric devices and additional thermal management devices for thermal management according to some example embodiments;

FIG. 9 shows a perspective view of a battery system having three series connected cells comprising thermoelectric devices and additional thermal management devices for thermal management according to some example embodiments;

FIG. 10 shows a battery system having three series connected cells comprising thin-film thermoelectric devices and an additional thermal management devices for thermal management according to some example embodiments;

FIG. 11 shows an exploded view of a button cell including thermoelectric devices for thermal management according to some example embodiments;

FIG. 12 shows a plurality of laminate sheets including thermoelectric devices configured for rolling into a battery assembly according to some example embodiments;

FIG. 13 shows an array of thermoelectric semiconductor elements in a grid configuration according to some example embodiments;

FIG. 14 shows an array of thermoelectric semiconductor elements in a column configuration according to some example embodiments;

FIG. 15 shows an a plurality of laminate sheets including thermoelectric devices rolled into a battery assembly according to some example embodiments;

FIG. 16 is a cross-section side view of a cell with a rolled configuration including thermoelectric devices according to some example embodiments; and FIG. 17 illustrates a battery system in association with example temperature readings at the cathodes and anodes of the cells;

FIG. 18 illustrates a battery system with heat sinks in association with example temperature readings at the cathodes and anodes of the cells;

FIG. 19 illustrates a battery system with thermoelectric devices in association with example temperature readings at the cathodes and anodes of the cells according to some example embodiments; and FIG. 20 illustrates a battery system with thermoelectric devices and heat sinks in association with example temperature readings at the cathodes and anodes of the cells according to some example embodiments.

DETAILED DESCRIPTION

Some non-limiting, example embodiments now will be described more fully hereinafter with reference to the accompanying drawings, in which some, but not all example embodiments are shown. Indeed, the examples described, and shown herein should not be construed as being limiting as to the scope, applicability, or configuration of the present disclosure. Rather, these example embodiments are provided so that this disclosure will satisfy applicable legal requirements. Like reference numerals refer to like elements throughout.

As used herein the term "or" is used as the logical or where any one or more of the operands being true results in the statement being true. As used herein, the phrase "based on" as used in, for example, "A is based on B" indicates that B is a factor that determines A, but B is not necessarily the only factor that determines A.

According to some example embodiments, a solution for battery thermal management is provided that leverages thermoelectric devices. In this regard, according to some example embodiments, thermoelectric devices may be electrically connected to the anode and cathode of a cell for a battery, such that the thermoelectric devices operate as a heat pump to remove heat from a high temperature anode or cathode and provide heat to a lower temperature anode or cathode, depending on whether the Li-ion battery is in charging or discharging condition.

In this regard, when a cell is being discharged, for example, when supplying electrical energy to a load, the cathode may increase in temperature and the anode may decrease in temperature. On the other hand, when a cell is being charged, for example via a battery charger, the cathode may decrease in temperature and the anode may increase in temperature. Often the charging and discharging cycles of a cell and the associated heating can degrade cell functionality, by, for example, forming pointed structures known as dendrites on the anode. Such dendrites can continue to grow as a thermal runaway condition arises (e.g., at temperatures between approximately 150 degrees Celsius (° C.) and approximately 210° C. depending on battery chemistry), leading to the dendrite, for example, piercing the separator of the cell between the anode and the cathode and causing a short circuit within the cell. As the temperature continues to increase "venting with flame" can occur, which can cause additional damage to the cell, in some instances rendering the cell inoperable.

As mentioned above, according to some example embodiments, thermoelectric devices strategically placed at the cathode and anode can operate to manage thermal conditions that occur within a cell during both charging and discharging to manage the entropy changes that occur at the anode and cathode, thereby flattening or normalizing the temperature profile across the cell of a battery. By doing so, the cell of a battery can, according to some example embodiments, maintain an optimal or near optimal operating temperature that not only reduces or eliminates the risk of thermal runaway and potential damage to the cell but also increases the energy output of the cell in the battery by avoiding high temperature conditions which can affect energy output as further described herein. Additionally, while thermal management of the cell is performed in an active manner based on the amount of electric current flowing through the cell and thus through the thermoelectric devices, according to some example embodiments, no additional temperature sensors and control electronics (e.g., transistor-based electronics) may be needed or required for thermal management. The thermoelectric devices at either ends of, for example, the Li-ion cell can provide the necessary pro-rated cooling and heating, desired at the opposite ends of the Li-ion cell during a high-rate discharge, depending on the discharge rate. Essentially, one of the features of some example embodiments, for example, relates to a higher cooling at the cathode with a higher current through the thermoelectric device (at the anode) during the higher discharge rate and automatically higher heating at the anode correspondingly with the higher current through the complementary thermoelectric device (at the anode). Essentially, since the same current (at charging or discharging) flows through the Li-ion cell and the thermoelectric device at either end, a self-regulated active thermal management system can be realized with minimal need for sensors and other electronic feedback loops. This could significantly reduce the cost of implementation of thermal management of Li-ion cells in a battery.

With reference to FIG. 1, a cell 100 of a battery, according to some example embodiments, is provided. In this regard, the cell 100 may include various components to support the operation of the cell 100 to, for example, provide energy to an electric load or receive energy from a battery charger to perform battery charging. With respect to the structure of the cell 100, the cathode 112 may be physically isolated from the anode 114 by the separator 118. The cathode 112 may be associated with a positive (+) electrode of the cell 100 and the anode 114 may be associated with a negative (−) electrode of the cell 100. According to some example embodiments, the cathode 112 may characterize the type of cell as being, for example, a Li-ion cell in battery. In this regard, according to some example embodiments, the cathode 112 may be formed as, for example a lattice structure, comprising cobalt, manganese, sulfur, nickel, iron, or the like, such as lithium cobalt oxide (or lithium cobaltate), lithium manganese oxide (also known as spinel or lithium manganate), lithium iron phosphate, lithium nickel manganese cobalt (or NMC), and lithium nickel cobalt aluminum oxide (or NCA). The anode 114 may be formed as a lattice structure comprising, for example, graphite, coke, silicon, or the like. According to some example embodiments, the anode 114 may also include, for example, a lithium foil that provides a source for lithium ions (Li-ions) within the cell 100. Further, the electrolyte 116 may be formed with a lithium salt such as lithium hexafluorophosphate (LiPF$_6$). The electrolyte 116 may be aqueous or non-aqueous. The electrolyte 116, which operates as an ion carrier or ion conductor (with respect to ions as opposed to electric conductors) between the cathode 112 and the anode 114 within the cell 100, may be disposed within the cell 100 as a liquid or solid substance. The separator 118 may be, for example, a fine porous polymer film, and may be configured to be a catalyst within the cell 100 that promotes the movement of ions from cathode 112 to anode 114 during charging and from anode 114 to cathode 112 during discharging. The separator 118 may be an electrical insulator with, for example, little or no electrical conductivity. The separator 118 may provide a barrier between the cathode 112 and the anode 114 while enabling the exchange of Li-ions between the cathode 112 and the anode 114. According to some example embodiments, based on the architecture of the cell 100, one or more separators 118 may be included.

During discharge, ordered Li-ions from the lattice of the anode 114 may pass into the electrolyte 116, which operates a carrier for Li-ions through the separator 118 to the cathode 112. This removal of Li-ions from the orderly configuration of the anode 114 into a disorderly configuration in the electrolyte 116, thereby resulting in an increase in entropy of the electrolyte 116, can cause heat to be absorbed by the anode 114 thereby cooling the anode 114. This cooling can reach a point where the anode does not want to release any more Li ions, due to thermodynamic reasons, and so it would be desirable to supply heat to the anode with a nearby thermoelectric heat pump. Also, the cooling (without the supply of the heat from a thermoelectric heat pump) can be so severe that the electrolyte in the vicinity of the anode can get cooled and its resistance increases and hence Joule losses, and thereby the electrical energy transferred from the Li-ion cell to the outside load can decrease and battery efficiency drop. Additionally, during discharge, the Li-ions may pass through the separator 118 carried by the electrolyte 116 to the cathode 112. Accordingly, the disorder of the Li-ions in the electrolyte 116 can lead to an ordered organization in a lattice structure of the cathode 112, which operates to reduce entropy in electrolyte 116 and the decrease in entropy causes the release heat at the cathode 112, thereby warming the cathode 112. This heating can reach a point where the cathode resistance can go up as well as the electrolyte in the vicinity of the cathode can have the organic solvents in the electrolyte heat up and becoming combustible. The increase in cathode resistance can cause Joule losses and less efficiency of a cell of a battery. Again, here, it would be desirable to supply cooling to the cathode with a nearby thermoelectric heat pump.

Alternatively, when the cell 100 is being charged, ordered Li-ions from the lattice structure of the cathode 112 may pass into the electrolyte 116, which operates as a carrier for Li-ions to pass through the separator 118 to the anode 114. The removal of Li-ions from the orderly configuration of the cathode 112 into a disorderly configuration in the electrolyte 116, thereby resulting in an increase in entropy of the electrolyte 116, can cause heat to be absorbed by the cathode 112 thereby cooling the cathode 112. Additionally, during charging, the Li-ions may pass through the separator 118 carried by the electrolyte 116 to the anode 114. Accordingly, the disorder of the Li-ions in the electrolyte 116 can lead to an ordered organization in the lattice structure of the anode 114, which operates to reduce entropy in electrolyte 116 and release heat at the anode 114, warming the anode 114. Thus the problems in charging, at the anode and cathode, are reversed with respect to discharging conditions. So, having the same thermoelectric heat pump adjacent, to the cathode and the anode, provides heating or cooling (depending on charging or discharging) and again being self-regulated because of the nature of direction of current flow.

Thus, according to some example embodiments, using the same thermoelectric devices at either ends (adjacent to the cathode and anode) self-regulation can be realized due to both the direction of current flow (depending on charging and discharging) and the quantity of current (depending on rate of charge or discharge from the Li-ion cell in the battery). These two features, plus the compactness and very small power or voltage drop in the in-line thermoelectric devices (<2%) make for an effective and safe thermal management system. The voltage drop across the thermoelectric devices may be, for example, less than 50%, less than 20%, less than 10%, less than 2%, or less than 1% of the voltage of the cell. According to some example embodiments, the structure of the Li-ion cell can be fundamentally changed by the addition of the thermoelectric devices at the cathode and anode to realize the benefits described herein.

In addition to the entropy changes within the cell 100 that lead to heating during operation, the cell 100 may also experience $I^2R$ or Joule-heating losses from, for example, electrical resistance in the anode 114, electrical resistance in the cathode 112, and bulk electrolyte resistance. Since these losses are a function of the electric current through the cell 100, as the electric current increases, the temperatures within the cell 100 may also increase. As such, high power demand loads and fast charging, where currents through the cell 100 are high, can cause significant heating within the cell 100. However, there are many applications where high power demand loads must be served or fast charging is required to place a device back in service (e.g., drones and other unmanned aerial vehicles). Further, in some applications, the temperature of the environment around the cell 100 may contribute to the heating of the cell 100.

According to some example embodiments, the cell 100 may also include a cathode thermoelectric device 150 and an anode thermoelectric device 160. The cathode thermoelectric device 150 may be operably coupled to the cathode 112 and may be configured to manage the temperature of the cathode 112 during operation of the cell 100 based on the electric current that passes through the cathode 112 and the cathode thermoelectric device 150. Similarly, the anode thermoelectric device 160 may be operably coupled to the anode 114 and may be configured to manage the temperature of the anode 114 during operation of the cell 100 based on the electric current that passes through the anode 114 and anode thermoelectric device 160. The cathode thermoelectric device 150 may be, according to some example embodiments, electrically connected in series between the cathode 112 and the positive terminal 113 for the cell 100. The anode thermoelectric device 160 may be, according to some example embodiments, electrically connected in series between the anode 114 and the negative terminal 115 for the cell 100.

With reference to FIG. 2, an example thermoelectric device 200 is provided that may be employed as the cathode thermoelectric device 150 or the anode thermoelectric device 160. FIG. 2 provides a side view of the thermoelectric device 200. The thermoelectric device 200, in the context of some example embodiments, may be a solid state device that, when an electric current is passed through the thermoelectric device 200, a temperature differential is generated between a first side 220 of the thermoelectric device 200 and a second side 230 of the thermoelectric device 200. In this regard, the first side 220 (e.g., the top side) may be disposed on an opposite side of the structure of the thermoelectric device 200 relative to the second side 230 (e.g., the bottom side). Based on the direction of electric current flow through the thermoelectric device 200 between the terminal 206 and the terminal 208, a "hot side" and a "cold side" of the thermoelectric device 200 may be defined. In this regard, for example, if an electric current flows from the terminal 206 to the terminal 208 (i.e., there is a positive voltage drop from terminal 206 to terminal 208), the first side 220 may be the hot side of the thermoelectric device 200 and the second side 230 may be the cold side of the thermoelectric device 200. Alternatively, for example, if an electric current flows from the terminal 208 to the terminal 206 (i.e., there is a positive voltage drop from terminal 208 to terminal 206), the first side 220 may be the cold side of the thermoelectric device 200 and the second side 230 may be the hot side of the thermoelectric device 200. As such, if the direction of the current flow through the thermoelectric device 200 switches or changes direction (e.g., discharging versus charging), then the hot side and cold side of the thermoelectric device 200 also switches. Due to this relationship between the direction of current flow (and associated voltage drop) and the hot/cold sides of the thermoelectric device 200, the terminals 206 and 208 may be connected to, for example, the cathode 112 or the anode 114 using one of two polarities, where each polarity is also associated with a respective structural configuration.

In this regard, the thermoelectric device 200 may include an array of thermoelectric semiconductor elements 202, such as, for example, p-type thermoelectric semiconductor elements. The thermoelectric semiconductor elements 202 may be electrically connected in parallel configurations across the terminals 206 and 208. To electrically connect the thermoelectric semiconductor elements 202, conductive interconnects 210 and 212 may be used. The interconnects 210 and 212 may be positioned such that the thermoelectric semiconductor elements 202 are electrically connected to the interconnects 210 and 212 by being affixed on or otherwise formed on one or both of the interconnects 210 and 212. The interconnects 210 and 212 may include a conductive material to facilitate the electrical connections. Further, the interconnects 210 and 212 may be formed in a variety of shapes, but are commonly a sheet or a plate. Because the interconnects 210 and 212 may be conductive, rather than the terminals 206 and 208 being protrusions as shown in FIG. 2, the terminals may be integrated into the interconnects 210 and 212 to allow for electrical connections to component external to the thermoelectric device 200 by, for example, stacking onto and otherwise physically attaching to the interconnects 210 and 212.

As further shown in FIGS. 3A and 3B, which provide perspective views of the thermoelectric device 200, the thermoelectric semiconductor elements 202 may be configured in an two dimensional (N×M) array. In this regard, FIG. 3A shows an example thermoelectric device 200 in an exploded view with an upper interconnect 210 removed from a lower interconnect 212. For example, from an assembly process perspective, the thermoelectric semiconductor elements 202 may be attached or formed on the lower interconnect 212 and the upper interconnect 210 may be affixed to or formed on the top surfaces of the thermoelectric semiconductor elements 202 as indicated by the arrows 232. Accordingly, FIG. 3B shows the thermoelectric device 200 in an assembled configuration with the upper interconnect 210 affixed to or formed on the thermoelectric semiconductor elements 202.

As such, the thermoelectric device 200 may have various shapes depending, for example, on the implementation environment of the thermoelectric device 200 or a cell that is operating with the thermoelectric device 200. For example, a rectangular-shaped (rectangular footprint) thermoelectric device 200 may be implemented, as shown in FIGS. 3A and 3B. However, the thermoelectric device 200 may fabricated in any shape that supports interconnection of the thermoelectric semiconductor elements 202 via upper interconnects 210 that are placed to support the electrical connection of thermoelectric semiconductor elements 202. For example, circular, oval, diamond, or triangle-shaped thermoelectric devices 200 may be fabricated (not shown). The shape of the thermoelectric device 200 may, for example, be matched, according to some example embodiments, to a shape of the cathode 112 or anode 114 of the cell 100. Regardless of the geometry of the thermoelectric device 200, according to some example embodiments, the thermoelectric semiconductor elements 202 may be electrically connected in parallel and disposed thermally in parallel.

Further, the thermoelectric semiconductor elements 202 may be disposed vertically between a first interconnect 212 (e.g., the lower interconnect 212) and a second interconnect 210 (e.g. the upper interconnect 210). According to some example embodiments, the second interconnects 210 and the first interconnects 212 may be disposed at respective positions to enable various electrical connection configurations, such as, for example, a singularity of p-type thermoelectric semiconductor elements 202 connected in parallel, or the like. As such, according to some example embodiments, the thermoelectric device 200 may be formed as a layered structure including, moving from top to bottom, the second interconnect 210, a thermoelectric semiconductor element 202, and the first interconnect 212. According to some example embodiments, the thermoelectric device 200 may include additional components in the form of structural plates that may be disposed on top of the second interconnect 210 or on the bottom of the first interconnect 212 (based on the orientation provided in FIGS. 3A and 3B). The plates may be formed of a material that, for example, has a high thermal conductivity, but is an electrical insulator. Further, rather than providing an interconnect or a structural plate, according to some example embodiments, the thermoelectric semiconductor elements 202 may be disposed directly on an external conductive surface of, for example, the cathode 112 or the anode 114 or an adjacent external casing for electrical connection and the thermal coupling.

While some thermoelectric devices may include thermoelectric semiconductor elements that are p-type and n-type, according to some example embodiments, the thermoelectric semiconductor elements 202 of the thermoelectric device 200 may have a single polarity as p-type thermoelectric semiconductor elements. As such, according to some example embodiments, only p-type thermoelectric semiconductor elements may be included in the thermoelectric device 200. As such, according to some example embodiments, the thermoelectric device 200 may be referred to as a unipolar device due to all thermoelectric semiconductor elements 202 being doped with higher concentrations of holes relative concentrations of free electrons. In this regard, each thermoelectric semiconductor element 202 may be doped in a manner that makes the elements formed of semiconductor material be electron acceptors, such that holes are the majority carriers and the electrons are the minority carriers. As such, the thermoelectric semiconductor elements 202 may be formed of, for example, silicon doped with boron, gallium, or the like to form p-type semiconductor materials or p-type $Bi_xSb_{2-x}Te_3$, p-type $Bi_2Te_3/Sb_2Te_3$ superlattices, p-PbTe etc. According to some example embodiments, each of the thermoelectric semiconductor elements 202 may be doped the same or differently. According to some example embodiments, the concentration of holes (concentration of dopant) within the p-type thermoelectric semiconductor elements 202 may differ between thermoelectric semiconductor elements 202 that are serially adjacent. In this regard, a first thermoelectric semiconductor element 202 may be doped to a first concentration and a second thermoelectric semiconductor element 202, that is, serially adjacent to the first thermoelectric semiconductor element 202, may be doped to a second concentration that is different from the first concentration.

According to some example embodiments, the structural configuration and dimensions of the thermoelectric semiconductor elements 202 within the thermoelectric device 200 may be designed for the purpose of managing temperature within an operating cell of a battery. For example, the dimensions of each thermoelectric semiconductor element 202 may be uniform across the array or the dimensions of the thermoelectric semiconductor elements 202 may vary, to some degree, across the array. For example, in areas where additional heat pump operation is needed, the thermoelectric semiconductor elements 202 in this area may have larger volumes (i.e., where height constrained, the length and width of some thermoelectric semiconductor elements 202 may be larger than others). Spacing between the thermoelectric semiconductor elements 202 may also be uniform or varied.

As mentioned above, the thermoelectric semiconductor elements 202 may be formed in a two-dimensional array. However, according to some example embodiments, layers or stages (also referred to as periods) of thermoelectric semiconductor elements 202 may be included to construct the thermoelectric device 200 that is stacked configuration of thermoelectric semiconductor elements 202. Such a multi-stage thermoelectric device 200 may be referred to as being or including a superlattice. In this regard, using additional plates for structural support and thermal conductivity between the stages, and electrically interconnecting each stage of thermoelectric semiconductor elements 202, for example, a four-stage thermoelectric device may be formed (e.g., having four stacked two dimensional arrays of thermoelectric devices). Again, the thicknesses of the stages and structure as a whole may be tailored for certain temperature properties. In this regard, additional examples of thermoelectric devices in the form of a superlattice are described in U.S. patent application Ser. No. 15/700,263 filed on Sep. 11, 2017 (U.S. publication no. 2018-0138106, published on May 17, 2018) entitled "Superlattice Structures for Thermoelectric Devices," the entire content of which is hereby incorporated herein by reference.

The thermoelectric device 200 may be fabricated in a variety of ways. For example, according to some example embodiments, the thermoelectric device 200 may be fabricated using, for example, bulk materials. In this regard, photolithographic and chemical processing steps may be performed to construct the thermoelectric device 200. Further, according to some example embodiments, the thermoelectric device 200 may be fabricated using thin film technologies. For example, the thermoelectric device 200 may be fabricated via metal-organic chemical vapour deposition (MOCVD) or by molecular beam epitaxy (MBE). Alternatively, physical vapour deposition (PVD), electrochemical deposition (ECD), and various forms of etching may be employed. In this regard, additional examples of thin-film thermoelectric devices, including p-type devices, and thermoelectric devices generally are described in U.S. patent application Ser. No. 15/700,263 filed on Sep. 11, 2017 (U.S. publication no. 2018-0138106, published on May 17, 2018) entitled "Superlattice Structures for Thermoelectric Devices," the entire content of which is hereby incorporated herein by reference.

As mentioned earlier, the thermoelectric device 200 may operate to generate a thermal differential across the structure of the device when a current is applied to the terminals of the device. In this regard, for example, when an electric current is applied such that the electric current flows from the terminal 206 to the terminal 208, charge carriers (i.e., in this case, free holes) in the p-type thermoelectric semiconductor elements 202 may be driven from the second side 230 to the first side 220. By driving the charge carriers in this manner, a temperature differential or gradient may formed between the second side 230 to the first side 220 to draw heat from the second side 230 to the first side 220. Additionally, a voltage drop $V_p$ may occur between the terminals 206 and 208. Alternatively, when an electric current is applied such that the electric current flows from the terminal 208 to the terminal 206, charge carriers (i.e., in this case free holes) in the p-type thermoelectric semiconductor elements 202 may be driven from the first side 220 to the second side 230. By driving the charge carriers in this manner, a temperature differential or gradient may formed between the first side 220 to the second side 230 to pull heat from the first side 220 to the second side 230 and a voltage drop $V_p$ may occur between the terminals 208 and 206.

Referring back to FIG. 1, as mentioned above, a thermoelectric device 200 may be operably coupled to the cathode 112 as a cathode thermoelectric device 150 and another thermoelectric device 200 may be operably coupled to the anode 114 as an anode thermoelectric device 160. In this regard, with reference to a thermoelectric device 200 operating as the cathode thermoelectric device 150, the second side 230 (which may also be referred to as the cathode side of the cathode thermoelectric device 150) may, for example, be thermally coupled (e.g., possibly through direct physical contact or via intermediate passive components, such as a thermally conductive casing or the like) with the cathode 112, and the terminal 206 may be electrically connected to the cathode 112. The first side 220 of the cathode thermoelectric device 150 (which may be referred to as the terminal side of the cathode thermoelectric device 150) may be thermally exposed to the environment (e.g., positioned away from the cathode 112 possibly within or external to the casing or housing of the cell 100), and the terminal 208 may be electrically connected to the positive terminal 113 of the cell 100.

Further, with reference to a thermoelectric device 200 operating as the anode thermoelectric device 160, the first side 220 (which may also be referred to as the anode side of the anode thermoelectric device 160) may, for example, be thermally coupled (e.g., possibly through direct physical contact or via intermediate passive components, such as a thermally conductive casing or the like) with the anode 114, and the terminal 208 may be electrically connected to the anode 114. The second side 230 of the anode thermoelectric device 160 (which may be referred to as the terminal side of the anode thermoelectric device 160) may be thermally exposed to the environment (e.g., positioned away from the anode 114 possibly within or external to the casing or housing of the cell 100), and the terminal 206 may be electrically connected to the negative terminal 115 of the cell 100. The second side 230 of the anode thermoelectric device 160 may therefore also be referred to as the terminal side of the anode thermoelectric device 160.

The thermal coupling between the cathode thermoelectric device 150 and the cathode 112 may be formed through a cathode thermal interface 116, and the thermal coupling between the anode thermoelectric device 160 and the anode 114 may be formed through the anode thermal interface 117. In this regard, these thermal interfaces may be formed via the various types of deposition of materials to fabricate the cathode thermoelectric device 150 and the anode thermoelectric device 160 on the cathode 112 and the anode 114, respectively. For example, as mentioned above, various thin-film deposition techniques may be utilized to form the cathode thermal interface 116 and the anode thermal interface 117. The thermal interface materials can range from Alumina [e.g., aluminum oxide ($Al_2O_3$)]-containing paste to liquid metal [like gallium tin (GaSn)] applications to graphite sheets or graphene sheets, etc.

Now with reference to FIG. 4, the operation of cell 100, comprising the cathode thermoelectric device 150 and the anode thermoelectric device 160, when being discharged is shown. In this regard, a load 250 may be applied to the cell 100 and the cell 100 may supply electric power to the load 250. As such, an electric current may flow from the cathode 112 through the cathode thermoelectric device 150, from the positive terminal 113, through the load 250, into the negative terminal 115, through the anode thermoelectric device 160, and to the anode 114. With respect to the flow of charge carriers, the electron current flows from the anode 114 and the anode thermoelectric device 160 to the cathode thermoelectric device 150 and the cathode 112. The flow of holes through the cathode thermoelectric device 150 is from the cathode 112 through the cathode thermoelectric device 150 to the positive terminal 113, and the flow of holes through the anode thermoelectric device 160 is from the negative terminal 115 through the anode thermoelectric device 160 to the anode 114. During discharge, a voltage drop $V_{P1}$ may occur across the cathode thermoelectric device 150 (referred to as the cathode thermoelectric device voltage drop). Similarly, during discharge, a voltage drop $V_{P2}$ may occur across the anode thermoelectric device 160 (referred to as the anode thermoelectric device voltage drop).

Due to the polarity of the cathode thermoelectric device 150, the cathode thermoelectric device 150 may pull or extract heat from the cathode 112 (i.e., the cathode side of the cathode thermoelectric device 150 being the cold side due to the flow of electric current) to the terminal side of the cathode thermoelectric device 150. As such, the cathode thermoelectric device 150 operates to reduce the temperature of the cathode 112, which experiences an increase in temperature during discharge of the cell 100. Due to the polarity of the anode thermoelectric device 160, the anode thermoelectric device 160 pulls or absorbs heat into the anode 114 (i.e., the anode side of the anode thermoelectric device 160 being the hot side) from the terminal side of the anode thermoelectric device 160. As such, the anode thermoelectric device 160 operates to increase the temperature of the anode 114, which experiences a decrease in temperature during discharge of the cell 100. As such, the cathode thermoelectric device 150 and the anode thermoelectric device 160 may operate collaboratively to form a heat pump that pumps heat out of the cell 100 from the cathode 112 and supplies heat to the anode 114 during discharging of the cell 100. As such, the temperature profile across the cell 100 (e.g., from anode 114 to cathode 112) is flattened and hot spots are reduced or eliminated relative to the temperature profile of a cell of a battery that does not employ the cathode thermoelectric device 150 and the anode thermoelectric device 160. For example, when discharging, the temperature maximum at the cathode 112 may be reduced and the temperature minimum at the anode 114 may be increased, thereby minimizing or clipping the peaks and the valleys of the temperature profile. Accordingly, the resistance across the cell 100 is also maintained at low levels thereby further reducing losses and associated heat as a result of the operation of the heat pump system formed by the cathode thermoelectric device 150 and the anode thermoelectric device 160.

Now with reference to FIG. 5, the operation of cell 100, comprising the cathode thermoelectric device 150 and the anode thermoelectric device 160, when being charged is shown. In this regard, a charger 260 may be applied to the cell 100 and the cell 100 may receive electric power from the charger 260. As such, an electric current may flow from the anode 114, through the anode thermoelectric device 160, from the negative terminal 115, through the charger 260, into the positive terminal 113, through the cathode thermoelectric device 150, and to the cathode 112. With respect to the flow of charge carriers, the electron current flows from the cathode 112 and the cathode thermoelectric device 150 to the anode thermoelectric device 160 and the anode 114. The flow of holes through the anode thermoelectric device 160 is from the anode 114 through the anode thermoelectric device 160 to the negative terminal 115, and the flow of holes through the cathode thermoelectric device 150 is from the positive terminal 113 through the cathode thermoelectric device 150 to the cathode 112. During charging, a voltage drop $V_{P1}$ may occur across the cathode thermoelectric device 150 (referred to as the cathode thermoelectric device voltage drop). Similarly, during charging, a voltage drop $V_{P2}$ may occur across the anode thermoelectric device 160 (referred to as the anode thermoelectric device voltage drop).

Due to the polarity of the anode thermoelectric device 160, the anode thermoelectric device 160 pulls or extracts heat from the anode 114 (i.e., the anode side of the anode thermoelectric device 160 being the cold side due to the flow of electric current) to the terminal side of the anode thermoelectric device 160. As such, the anode thermoelectric device 160 operates to reduce the temperature of the anode 114, which experiences an increase in temperature during charging of the cell 100. Due to the polarity of the cathode thermoelectric device 150, the cathode thermoelectric device 150 pulls or absorbs heat into the cathode 112 (i.e., the cathode side of the cathode thermoelectric device 150 being the hot side) from the terminal side of the cathode thermoelectric device 150. As such, the cathode thermoelectric device 150 operates to increase the temperature of the cathode 112, which experiences a decrease in temperature during charging of the cell 100. Accordingly, the anode thermoelectric device 160 and the cathode thermoelectric device 150 may operate collaboratively to form a heat pump that pumps heat out of the cell 100 from the anode 114 and supplies heat to the cathode 112 during charging of the cell 100. As such, the temperature profile across the cell 100 (e.g., from anode 114 to cathode 112) is flattened and hot spots are reduced or eliminated relative to the temperature profile of a cell of a battery that does not employ the cathode thermoelectric device 150 and the anode thermoelectric device 160. Accordingly, the resistance across the cell 100 is also maintained at low levels thereby further reducing losses and associated heat as a result of the operation of the heat pump system formed by the cathode thermoelectric device 150 and the anode thermoelectric device 160.

Referring now to FIG. 6, an example battery system 300, comprising the cell 100, with additional thermal management features is provided, in accordance with some example embodiments. In this regard, the battery system 300 may include one or more heat sinks or fans. For example, the battery system 300 may include a cathode heat sink 310 (e.g., a cathode battery heat sink 310), an anode heat sink 320 (e.g., an anode battery heat sink), a cathode fan 330 (e.g., a cathode battery fan 330), and an anode fan 340 (e.g., an anode battery fan 340).

The cathode heat sink 310 and the anode heat sink 320 may be formed as any type of heat sink device that is configured to operate as a passive heat exchanger between two media. According to some example embodiments, a heat sink may be formed of a highly thermally conductive material, such as, for example, aluminum. Further according to some example embodiments, a heat sink may include a base portion that is formed as a plate with a first side of the plate being configured to be thermally coupled to a surface for thermal management and a second side of the plate that includes fins or posts. In example embodiments with fins, the fins may disposed parallel to each other and may be curved or fanned out to add surface area to the device while limiting the height. In example embodiments with posts, the post may be disposed in various patterns, such as, for example, a grid pattern. The fins or posts operate to increase the surface area of the heat sink to facilitate either radiating heat conducted through the heat sink from the surface for thermal management or absorbing heat into the heat sink for delivery to the surface for thermal management.

The cathode fan 330 and the anode fan 340 may include any type of motorized rotating device that operates to create a thermal flow for exchanging heat. In this regard, a fan may include an electric motor mechanically coupled to a fan blade to rotate the fan blade to generate the thermal flow. A fan may be powered by an electric current that may, for example, be provided by a cell such as cell 100 via, for example, electrical connection to the positive terminal 113 and the negative terminal 115 (not shown in FIG. 6). According to some example embodiments, a direction of rotation for the electric motor of a fan may be based on the direction of electric current flow through the motor.

According to some example embodiments, heat sinks and fans may be combined to form an efficient heat management system. In this regard, a fan may be affixed to the fins or posts of a heat sink to move a fluid (e.g., air) away from fins or posts to remove heat from the heat sink and cool the heat sink and the surface for thermal management to which the heat sink is thermally coupled. Alternatively, a fan may be affixed to the fins or posts of a heat sink to move a fluid (e.g., air) toward the fins or posts to introduce heat to the heat sink to warm the heat sink and the surface for thermal management to which the heat sink is thermally coupled.

Accordingly, heat sinks and fans may be used in conjunction with thermoelectric devices to from a thermal management system for a cell or collection of cells for a battery. In this regard, according to some example embodiments, a cathode heat sink 310 may be thermally coupled with the cathode thermoelectric device 150. According to some example embodiments, the thermal coupling between the cathode heat sink 310 and the cathode thermoelectric device 150 may be due to direct physical contact between the cathode heat sink 310 and the cathode thermoelectric device 150. Alternatively, the cathode heat sink 310 may be applied, for example, to an external casing of the cell 100 near the cathode thermoelectric device 150 to provide additional thermal management. Additionally, cathode fan 330 may be attached to or otherwise operably coupled with the cathode heat sink 310 to provide additional thermal management capabilities. In this regard, the cathode heat sink 310 may be configured to remove or radiate heat from the cathode thermoelectric device 150 and the cathode 112 when the cell 100 is powering a load (e.g., load 250). In this regard, the cathode fan 330 may be electrically connected such that the rotation of the fan blade by the fan motor operates to move a fluid (e.g., air) away from the fins or posts of the cathode heat sink 310 to remove heat from the fins or posts and cool the cathode heat sink 310. Alternatively, when the cell 100 is being charged (e.g., by charger 260), the cathode heat sink 310 may be configured absorb or pull heat to the cathode thermoelectric device 150 and the cathode 112. In this regard, the cathode fan 330 may be electrically connected such that the rotation of the fan blade by the fan motor operates to move a fluid (e.g., air) toward the fins or posts of the cathode heat sink 310 to force heat into the fins or posts and warm the cathode heat sink 310.

According to some example embodiments, an anode heat sink 320 may be thermally coupled with the anode thermoelectric device 160. According to some example embodiments, the thermal coupling between the anode heat sink 320 and the anode thermoelectric device 160 may be due to direct physical contact between the anode heat sink 320 and the anode thermoelectric device 160. Alternatively, the anode heat sink 320 may be applied, for example, to an external casing of the cell 100 near the anode thermoelectric device 160 to provide additional thermal management. Additionally, anode fan 340 may be attached to or otherwise operably coupled with the anode heat sink 320 to provide additional thermal management capabilities. In this regard, the anode heat sink 320 may be configured absorb or pull heat to the anode thermoelectric device 160 and the anode 114 when the cell 100 is powering a load (e.g., load 250). In this regard, the anode fan 340 may be electrically connected such that the rotation of the fan blade by the fan motor operates to move a fluid (e.g., air) toward the fins or posts of the anode heat sink 320 to force heat into the fins or posts and warm the anode heat sink 320. Alternatively, when the cell 100 is being charged (e.g., by charger 260), the anode heat sink 320 may be configured remove or radiate heat from the anode thermoelectric device 160 and the anode 114. In this regard, the anode fan 340 may be electrically connected such that the rotation of the fan blade by the fan motor operates to move a fluid (e.g., air) away from the fins or posts of the anode heat sink 320 to remove heat from the fins or posts and cool the anode heat sink 320.

Accordingly, the cathode thermoelectric device 150, cathode heat sink 310, and cathode fan 330 may be configured to operate in cooperation with the anode thermoelectric device 160, anode heat sink 320, and anode fan 340 to embody a more robust heat pump system. As such, for the battery system 300, the temperature profile across the cell 100 (e.g., from anode 114 to cathode 112) may be further flattened and hot spots may be further reduced or eliminated relative to the temperature profile of a cell that does not employ such features. Accordingly, the resistance across the cell 100 may also maintained at increasingly low levels thereby further reducing losses and associated heat as a result of the operation of the heat pump system employed in the battery system 300.

While the example battery system 300 includes both heat sinks and fans, it is contemplated that, according to some example embodiments, thermal management may be performed using fans without heat sinks, or heat sinks without fans. Further, according to some example embodiments, heat sinks or fans may be applied to the cathode side of the cell 100 and not the anode side of the cell 100, or heat sinks or fans may be applied to the anode side of the cell 100 and not the cathode side of the cell 100.

Now referring to FIG. 7, an example battery system 400 (which may also be referred to as a battery) is shown that includes two cells, i.e., cell 100 and cell 401. The cell 100 may be configured as described above. Additionally, the cell 401 may configured similar to cell 100 with a negative terminal 115 electrically connected to the load 250. In this regard, cell 401 may include a cathode 412 and an anode 414 with electrolyte 416 and a separator 418 disposed there between. A cathode thermoelectric device 450 may be thermally coupled and electrically connected to the cathode 412. A positive terminal 413 may be electrically connected to the cathode thermoelectric device 450, which be electrically connected to the load 250.

The battery system 400 may operate in a similar manner as described above with respect to the single cell embodiments described with respect to FIGS. 4 and 5. As such, the cell 100 may be electrically connected in series with the cell 401 relative to the load 250. However, assuming that the voltage across the cell 100 is the same as the voltage across cell 401, the voltage across the load 250 may be double, relative to the embodiments described with respect to FIG. 4.

With that said, a difference in the battery system 400 is that the cathode thermoelectric device 150 of cell 100 may be thermally coupled and electrically connected to the anode thermoelectric device 460 of the cell 401. In this regard, the two thermoelectric devices may, according to some example embodiments, be stacked as a multi-stage device as described above. Further, according to some example embodiments, a single thermoelectric device (e.g., a single stage thermoelectric device) may be disposed between the anode 414 and the cathode 112 and thereby the cathode thermoelectric device 150 and the anode thermoelectric device 460 may be the same device. Alternatively, the cathode thermoelectric device 150 may be electrically connected to the anode thermoelectric device 460, however there may be no thermal coupling, according to some example embodiments, between the cathode thermoelectric device 150 and the anode thermoelectric device 460 due to, for example, physical constraints such as within the casing of a multi-cell battery pack.

Regardless of the configuration, the anode thermoelectric device 460 and the cathode thermoelectric device 150 may contribute to the heat pump operation in the system 400. In this regard, when discharging the battery system 400, heat from the cathode 112 may be provided or pumped to the anode 414, and heat from the cathode thermoelectric device 450 may be pumped to the anode thermoelectric device 160.

Now referring to FIG. 8, an example battery system 500, with thermal management via thermoelectric devices, is provided. The battery system 500 includes three cells 510, 520, and 530, although according to some example embodiments any number of cells may be incorporated into the battery system 500. The cells 510, 520, and 530 may include shared thermoelectric devices on the ends and between the cells for thermal management via heat pump operation as described above. These thermoelectric devices may be formed, for example, using bulk semiconductor materials. In this regard, each of cells 510, 520, and 530 may include internal components to support cell operation such as a cathode, an anode, an electrolyte, and a separator as described above with respect to cell 100.

According to some example embodiments, the cells 510, 520, and 530 may be button cells. In this regard, each of cells 510, 520, and 530 may include an external casing or housing formed from a cathode casing and an anode casing. Each of the cathode casing and the anode casing may have a cup shape where a diameter of the anode casing is less than the diameter of the cathode case such that the anode casing may slide into the cathode casing to form a cell cavity for receiving the internal battery components. The cathode casing may be disposed on a side of the cell closest to the cathode and the cathode casing may be electrically connected to the cathode. The cathode casing may be formed of an electrically and thermally conductive material, such as aluminum. Similarly, the anode casing may be disposed on a side of the cell closest to the anode and the anode casing may be electrically connected to the anode. The anode casing may be formed of an electrically and thermally conductive material, such as aluminum. The anode casing may be sealed to the cathode casing to prevent leaking of, for example, the electrolyte of the cell.

As such, the cell 510 may include a cathode casing 511 and an anode casing 512. The cell 520 may include a cathode casing 521 and an anode casing 522, and the cell 530 may include a cathode casing 531 and an anode casing 532.

As mentioned above, thermoelectric devices may be disposed on and between the cells 510, 520, and 530 to facilitate providing heat pumping action in the battery system 500 as described above. In this regard, a first thermoelectric device 505 may be disposed such that a first side of the first thermoelectric device 505 is thermally coupled and electrically connected to the cathode casing 511 (and thus the cathode) of cell 510 and a second side of the first thermoelectric device 505 may be thermally coupled to a heat sink 310 and a fan 330 as described above.

A second thermoelectric device 515 may be positioned between, and may be a shared component of, the cells 510 and 520. In this regard, the second thermoelectric device 515 may be thermally coupled and electrically connected to the anode casing 512 (and thus the anode) of cell 510. The second thermoelectric device 515 may be thermally coupled and electrically connected to the cathode casing 521 (and thus the cathode) of the cell 520.

A third thermoelectric device 525 may be positioned between, and may be a shared component of, the cells 520 and 530. In this regard, the third thermoelectric device 525 may be thermally coupled and electrically connected to the anode casing 522 (and thus the anode) of cell 520. The third thermoelectric device 525 may be thermally coupled and electrically connected to the cathode casing 531 (and thus the cathode) of the cell 530.

A fourth thermoelectric device 535 may be disposed such that a first side of the fourth thermoelectric device 555 is thermally coupled to a heat sink 320 and a fan 340 as described above. Additionally, a second side of the fourth thermoelectric device 535 may be thermally coupled and electrically connected to the anode casing 532 (and thus the anode) of cell 530.

In operation, the thermal management components (e.g., the thermoelectric devices, heat sinks, fans, etc.) may operate in coordination to perform a heat pumping operation or action as described above. For example, when the battery system 500 is discharging, heat may be pumped from the cathode side of the system (i.e., from the first thermoelectric device 505) to the anode side of the system (i.e., to the fourth thermoelectric device 535). Internally, the second thermoelectric device 515 may operate to support heat pump operation by pulling heat from the cathode of cell 520 to the anode of cell 510 during discharging. Similarly, the third thermoelectric device 525 may operate to support heat pump operation by pulling heat from the cathode of cell 530 for provision to the anode of cell 520. Further, the cathode heat sink 310 and the cathode fan 330 may pull heat from the cathode side of the system 500 (e.g., from the first thermoelectric device 505). Additionally, the anode heat sink 320 and the anode fan 340 may draw heat into the anode side of the system 500 (e.g., to the fourth thermoelectric device 535) during discharge.

During charging of the system 500, heat may be pumped from the anode side of the system (i.e., from the fourth thermoelectric device 535) to the cathode side of the system (i.e., to the first thermoelectric device 505). Internally, the third thermoelectric device 525 may operate to support heat pump operation by pulling heat from the anode of cell 520 and providing heat to the cathode of cell 530 during charging. Similarly, the second thermoelectric device 515 may operate to support heat pump operation by pulling heat from the anode of cell 510 and providing heat to the cathode of cell 520. Further, the anode heat sink 320 and the anode fan 340 may pull heat from the anode side of the system 500 (e.g., from the fourth thermoelectric device 535). Additionally, the cathode heat sink 310 and the cathode fan 330 may draw heat into the cathode side of the system 500 (e.g., to the first thermoelectric device 505) during charging.

Again, the heat pumping operation of these thermal management components may operate to create a temperature profile across the battery system 500 (e.g., from anode side to cathode side of the system 500) that is flattened and hot spots are reduced or eliminated relative to the temperature profile of a battery system that does not employ the thermoelectric devices 505, 515, 525, and 535, and the heat sinks 310, 320, and the fans 330, 340. Additionally, a reduction in operating temperature in addition to a flattened temperature profile may be achieved which may result in lower resistance across the battery system 500 thereby further reducing losses and associated heat as a result of the operation of the heat pump system formed by the thermoelectric devices, heat sinks, and fans.

FIG. 9 shows a perspective view of another example battery system 550, which is similar to the battery system 500. The battery system 550 may include the cells 510, 520, and 530, with the thermoelectric devices 505, 515, 525, and 535, each of which being configured to operate and be positioned as described above. The battery system 550 also includes cathode heat sink 310 and anode heat sink 320, albeit without cathode fan 330 and anode fan 340. As shown in FIG. 9, the battery system 550 may be symmetrical about the axis 551 and the top and bottom surfaces of the components may be disposed on planes that are perpendicular or orthogonal to axis 551.

Referring now to FIG. 10, an alternative construction of a battery system 600, which is similar in operation to the battery system 500, is provided. In this regard, the example battery system 600 is also configured to perform thermal management of the cells 510, 520 and 530 via operation of thermoelectric devices. However, rather than being formed from bulk semiconductor materials, the thermoelectric devices of battery system 600 may be formed of thin-film thermoelectric devices. As mentioned above, such thin-film thermoelectric devices may be formed or fabricated via various processes including, for example, MOCVD, MBE, PVD, ECD, or various other forms thin-film deposition and etching. Because the thermoelectric devices of the battery system 600 are formed via thin-film deposition techniques, the structure of the thermoelectric devices may be smaller and require less space (volume) within, for example, a casing or housing of a cell or system.

As such, the battery system 600 operates in a similar fashion as the battery system 500 described above and has a similar architecture. In this regard, the first thermoelectric device 605 is positioning and operates in the same manner as the first thermoelectric device 505, the second thermoelectric device 615 is positioned and operates in the same manner as the second thermoelectric device 515, the third thermoelectric device 625 is positioned and operates in the same manner as the second thermoelectric device 515, and the fourth thermoelectric device 635 is positioned and operates in the same manner as the second thermoelectric device 515. In this regard, additional examples of thin-film thermoelectric devices, including p-type devices stacked in a superlattice, and thermoelectric devices formed as a superlattice generally are described in U.S. patent application Ser. No. 15/700,263 filed on Sep. 11, 2017 (U.S. publication no. 2018-0138106, published on May 17, 2018) entitled "Superlattice Structures for Thermoelectric Devices," the entire content of which is hereby incorporated herein by reference.

Referring now to FIG. 11, an exploded view of an example cell 700 in the form of a button cell is shown. The cell 700, according to some example embodiments, includes thermoelectric devices for thermal management of the cell 700 disposed internal to the casing of the cell 700. The components of the cell 700 may be disposed in symmetric positions about a central axis 705. Further, the components of the cell 700 in the exploded view of FIG. 11 are removed from their assembled positions only in the vertical direction. The relationship between the positions and orientations of the components in the horizontal direction has been maintained.

In this regard, the cell 700 may include a cathode casing 710 and an anode casing 715. The cathode casing 710 and the anode casing 715 may be formed of an electrically conductive material such as aluminum or an aluminum alloy that may be sufficiently resistant to corrosion that might occur due to interaction with the electrolyte substance disposed within the cell 700. According to some example embodiments, the cathode casing 710 may be formed as a cup having a diameter that permits the anode casing 715 to fit within to form a sealed cavity. Further, an insulating seal (not shown) may be disposed between the cathode casing 710 and the anode casing 715 to prevent shorting of the cell 700.

Internal to the cavity formed by the cathode casing 710 and the anode casing 715, the cell 700 may include a cathode 720, an anode 725, a separator 730, and an electrolyte (not shown). In composition and operation, the cathode 720 may be same or similar to the cathode 120 of cell 100, the anode 725 may be same or similar to the anode 114 of cell 100, and the separator 730 may be the same or similar to the separator 118 of the cell 100.

Additionally, the cell 700 may also include a cathode thermoelectric device 740, that is, from a composition and operation perspective, the same or similar to the cathode thermoelectric device 150, and an anode thermoelectric device 750 that is, from a composition and operation perspective, the same or similar to the anode thermoelectric device 160. As such, the cathode thermoelectric device 740 may be thermally coupled (e.g., in direct physical contact) with the cathode 720 and electrically connected to the cathode 720. The cathode thermoelectric device 740 is also electrically connected to the cathode casing 710 and may be thermally coupled to the cathode casing 710. Similarly, the anode thermoelectric device 160 may be thermally coupled (e.g., in direct physical contact) with the anode 725 and electrically connected to the anode 725. The anode thermoelectric device 750 is also electrically connected to the anode casing 715 and may be thermally coupled to the anode casing 715.

As such, with respect to the architecture of the cell 700, the cathode thermoelectric device 740 may have a same length and width dimensions as the cathode 720 to, for example, maximize the surface area contact between the cathode thermoelectric device 740 and the cathode 720 and therefore maximize heat exchange between the cathode thermoelectric device 740 and the cathode 720. Further, the cathode thermoelectric device 740 may be constructed as planar device (e.g., no curvature) and the cathode 720 may also be a planar device. As such, the cathode thermoelectric device 740 may be disposed in a plane parallel with a plane of the cathode 720. Similarly, the anode thermoelectric device 750 may have a same length and width dimensions as the anode 725 to, for example, maximize the surface area contact between the anode thermoelectric device 750 and the anode 725 and therefore maximize heat exchange between the anode thermoelectric device 750 and the anode 725. Further, the anode thermoelectric device 750 may be constructed as planar device and the anode 725 may also be a planar device. As such, the anode thermoelectric device 750 may be disposed in a plane parallel with a plane of the cathode 720. Additionally, the separator 730 may be a planar device. According to some example embodiments, the cathode thermoelectric device 740 and the anode thermoelectric device 750 may be disposed in respective planes that are parallel to the plane of the separator 730.

FIGS. 12-15 illustrate the implementation of thermal management via thermoelectric devices in the context of a rolled cell, as opposed to the generally planar button cell configuration shown in FIG. 11. In this regard, the process of forming a rolled cell may begin with a plurality of rollable laminate sheets for the various components of the cell that are then spirally wrapped, e.g., are rolled up/onto themselves in a spiral manner (like a "Swiss roll") to form the internal assembly of the cell.

In this regard, referring to FIG. 12, the cell may include a cathode sheet 920, a first separator sheet 930, an anode sheet 940, and a second separator sheet 960. Although these components may be provided in the form of sheets, the materials used to form these components and operation of these components may be the same as described with respect to cell 100.

Additionally, a cathode thermoelectric device 910 may be formed on, in the various manners described herein, the cathode sheet 920 such that the cathode thermoelectric device 910 is thermally coupled and electrically connected to the cathode sheet 920. In FIG. 12, the cathode thermoelectric device 910 is shown as a separate sheet which may be the case, however, according to some example embodiments, the cathode thermoelectric device 910 may be formed directly on the cathode sheet 920 such that the cathode thermoelectric device 910 and the cathode sheet 920 are integrated.

Similarly, an anode thermoelectric device 950 may be formed, in the various manners described herein, on the anode sheet 940 such that the anode thermoelectric device 950 is thermally coupled and electrically connected to the anode sheet 940. Again, in FIG. 12, the anode thermoelectric device 950 is shown as a separate sheet which may be the case, however, according to some example embodiments, the anode thermoelectric device 950 may be formed directly on the anode sheet 940 such that the anode thermoelectric device 950 and the anode sheet 940 are integrated. According to some example embodiments, the cathode thermoelectric device 910 may be constructed and operate in the same manner as describe above for, for example, the cathode thermoelectric device 150, and the anode thermoelectric device 950 may be constructed and operate in the same manner as described above for, for example, the anode thermoelectric device 160.

For the rolled cell to operate properly, the sheets may be layered in a particular order prior to rolling. In this regard, referencing FIG. 12, according to some example embodiments, the cathode thermoelectric device 910 may be disposed on a top surface of the cathode sheet 920. The first separator 930 may be placed below the cathode sheet 930 and above the anode sheet 940 to electrically isolate the cathode sheet 920 from the anode sheet 940. According to some example embodiments, the anode thermoelectric device 940 may be disposed on a bottom surface of the anode sheet 940. The second separator 960 may be placed below the anode thermoelectric device 950 and the anode sheet 940, such that when the assembly is rolled, the second separator 960 may isolate the anode thermoelectric device 950 and the anode sheet 940 from the cathode thermoelectric device 910 and the cathode 920.

The cathode thermoelectric device 910 and the anode thermoelectric device 950 may be formed in variety of structures where the thermoelectric semiconductor elements are interconnected in a variety of ways. While the configurations of thermoelectric semiconductor elements shown in FIGS. 13 and 14 are described in the context of being applied to the cathode sheet 920 or the anode sheet 940, the same configurations and variations thereof are equally applicable in other contexts, such as in the button cell 700.

In this regard, the thermoelectric devices shown in FIGS. 13 and 14 may be embodied as cathode thermoelectric devices or anode thermoelectric devices and the base 1000 may be formed as a cathode or an anode. In this regard, specifically referring to FIG. 13, a grid pattern of thermoelectric semiconductor elements 1005 is shown. The thermoelectric semiconductor elements 1005 may be formed and operate in the same manner as the thermoelectric semiconductor elements 202, described above. With the base 1000 being either the cathode or the anode, the thermoelectric semiconductor elements 1005 may be disposed in direct contact with the base 1000 to form both a thermal coupling and an electrical connection. The thermoelectric semiconductor elements 1005 may also be electrically connected via interconnects 1010. In the configuration shown in FIG. 13, each of the thermoelectric semiconductor elements 1005 is electrically connected to each other of the thermoelectric semiconductor elements 1005, either via the interconnects 1010 or the terminal 1015. The terminal 1015 may be a conductive member that, according to some example embodiments, connects across all the columns of thermoelectric semiconductor elements 1005.

With respect to FIG. 14, a similar configuration is shown with the exception of the thermoelectric semiconductor elements 1005 being formed in elongated columnar shapes or strips. Again, the thermoelectric semiconductor elements 1005 may be formed on the base 1000 such that the thermoelectric semiconductor elements 1005 are thermally coupled and electrically connected to the base 1000. Further, the thermoelectric semiconductor elements 1005 may again be electrically connected via the interconnects 1010 and the terminal 1015.

Accordingly, regardless of the architecture of the thermoelectric devices, the sheets described in FIG. 12 may be rolled into a roll assembly 900 as shown in FIG. 15. According to some example embodiments, the layers of sheet may be rolled around a core 901, or no core may be used. FIG. 15 shows core 901 as being a circular core, but any shape of core may be used, such as a rectangular core. FIG. 15 shows the various layered sheets separated and fanned out. In this regard, the layered sheets include the cathode sheet 920, which includes the cathode thermoelectric device 910, followed by the first separator sheet 930, followed by the anode sheet 940, which includes the anode thermoelectric device 950, followed by the second separator 960.

To further visualize the construction of the roll assembly 900, FIG. 16 is provided, which is a cross-section view of a rolled cell 904 comprising the roll assembly 900. The layered configuration of the component sheets is shown, where the cathode 920 is electrically connected to the terminal 903 and the anode 940 is electrically connected to the terminal 902. Because the thermoelectric devices 910 and 950 are disposed internal to the cell 904, the electric currents through to the thermoelectric devices may occur due to an electrical connected with the electrolyte of the cell 904. As such, electric current may flow through the cathode thermoelectric device 910 to the cathode 920, to the electrolyte (not shown), to the anode 940, and then to the anode thermoelectric device 950. Alternatively, electric current may flow through the anode thermoelectric device 950 to the anode 940, to the electrolyte (not shown), to the cathode 920, and then to the cathode thermoelectric device 910.

As can be seen in the configuration shown in FIG. 16, the cathode thermoelectric device 910 and the anode thermoelectric device 950 may operate to perform a heat pumping operation to move heat from the cathode sheet 920 to the anode sheet 940 when discharging. Similarly, the cathode thermoelectric device 910 and the anode thermoelectric device 950 may operate to perform a heat pumping operation to move heat from the anode sheet 940 to the cathode sheet 920 when charging. Again, this heat pumping operation operates generate a temperature profile across the structure of the cell 904 that is flattened and hot spots may be reduced or eliminated relative to the temperature profile of a cell that does not employ such thermoelectric devices. Accordingly, the resistance across the cell 904 may also maintained at increasingly low levels thereby further reducing losses and associated heat as a result of the operation of the heat pumping employed in the cell 904.

FIGS. 17-20 illustrate the temperature profiles for a battery system comprising three series stacked cells to show the effect of the inclusion of the thermoelectric devices on discharging cells that are at an ambient temperature of 32° C. and not across a load (not shown). In this regard, FIG. 17 shows three button cells, cell A 1101, cell B 1102, and cell C 1103, and a chart showing temperature measurements taken at the cathode and anode of each cell. As shown in FIG. 17, the cells 1101, 1102, and 1103 are positioned in a stacked series configuration with no temperature management features. Due to the discharging, the temperatures of the cathodes are higher than the temperatures of the anodes. In this regard, the graph 1104 shows the following temperatures: Cathode A is 55° C., Anode A is 25° C., Cathode B is 55° C., Anode B is 25° C., Cathode C is 55° C., and Anode C is 25° C. As such, it can be seen that the cathodes are hot spots within the battery system and there is a wide variation between the temperatures (e.g., 30° C.). Such high temperatures and the existence of hot spots affects the operation of the battery system by, for example, allowing for increased losses due to higher system resistance and the possibility of thermal runaway conditions.

FIG. 18 shows the cells 1101, 1102, and 1103 with heat sinks 1105 and 1106 coupled to the ends of the battery system. The effect of the heat sinks 1105 and 1106 reduces the temperatures at the ends of the system, but temperature differences internal to the system are still substantial (in this case, on the order of approximately 30° C.) creating hot spots. In this regard, the graph 1107 shows the following temperatures: Cathode A is 50° C., Anode A is 25° C., Cathode B is 55° C., Anode B is 25° C., Cathode C is 55° C., and Anode C is 30° C. As such, it can be seen that the cathodes are hot spots within the battery system and there is a wide variation between the temperatures (e.g., 30° C.). Again, such high temperatures and the existence of hot spots affects the operation of the battery system by, for example, allowing for increased losses due to higher system resistance and the possibility of thermal runaway conditions.

FIG. 19 shows the cells 1101, 1102, and 1103 with thermoelectric devices 1108, 1109, 1110, and 1111, according to some example embodiments coupled to the ends of the battery system and in between the cells. The effect of the thermoelectric devices 1108, 1109, 1110, and 1111 reduces the temperatures across the system and flattens the temperature profile across the system due to the heat pumping action caused by thermoelectric devices 1108, 1109, 1110, and 1111, as described herein. In this regard, the graph 1112 shows the following temperatures: Cathode A is 40° C., Anode A is 40° C., Cathode B is 40° C., Anode B is 40° C., Cathode C is 40° C., and Anode C is 40° C. As such, it can be seen that a flat temperature profile at 40° C. is achieved with little or no variation in temperature across the system thereby limiting or eliminating hot spots. The reduced temperatures and variation in internal temperatures have the effect of permitting the system to operate more efficiently by avoiding losses and the risk of thermal runaway.

FIG. 20 shows the cells 1101, 1102, and 1103 with thermoelectric devices 1108, 1109, 1110, and 1111, and heat sinks 1105 and 1106 according to some example embodiments. The effect of the thermoelectric devices 1108, 1109, 1110, and 1111 and the heat sinks 1105, 1106 further reduces the temperatures across the system and again flattens the temperature profile across the system due to the heat pumping action caused by the thermoelectric devices 1108, 1109, 1110, and 1111, as described herein. In this regard, the graph 1113 shows the following temperatures: Cathode A is 35° C., Anode A is 35° C., Cathode B is 35° C., Anode B is 35° C., Cathode C is 35° C., and Anode C is 35° C. As such, it can be seen that a flat temperature profile at 35° C. is achieved with little or no variation in temperature across the system thereby limiting or eliminating hot spots. The temperature of system is also reduced due to the operation of the heat sinks 1105 and 1106 in conjunction with the heat pumping action performed by the thermoelectric devices 1108, 1109, 1110, and 1111. The further reduced temperatures and the lack of temperature variation have the effect of permitting the system to operate more efficiently by avoiding losses and the risk of thermal runaway.

Many modifications and other embodiments to those set forth herein will come to mind to one skilled in the art to which the present application pertains having the benefit of the teachings presented in the foregoing descriptions and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements or functions, it should be appreciated that different combinations of elements or functions may be provided by alternative embodiments without departing from the scope of the appended claims. In this regard, for example, different combinations of elements or functions than those explicitly described above are also contemplated as may be set forth in some of the appended claims. In cases where advantages, benefits or solutions to problems are described herein, it should be appreciated that such advantages, benefits or solutions may be applicable to some example embodiments, but not necessarily all example embodiments. Thus, any advantages, benefits, or solutions described herein should not be thought of as being critical, required, or essential to all embodiments or to that which is claimed herein. Although specific terms are employed herein, they are used in a generic and descriptive sense only and not for purposes of limitation.

What is claimed is:

1. An apparatus comprising:
a cell of a battery, the cell comprising an anode and a cathode;
an anode p-type thermoelectric device electrically coupled to the anode of the cell, the anode p-type thermoelectric device being connected in electrical series with the anode of the cell such that an electric current that passes through the anode of the cell also passes through the anode p-type thermoelectric device; and
a cathode p-type thermoelectric device electrically coupled to the cathode of the cell, the cathode p-type thermoelectric device being connected in electrical series with the cathode of the cell such that an electric current that passes through the cathode of the cell also passes through the cathode p-type thermoelectric device;
wherein the cathode p-type thermoelectric device and the anode p-type thermoelectric device remove heat from the cathode and provide heat to the anode in response to the cell being discharged, and remove heat from the anode and provide heat to the cathode in response to the cell being charged.

2. The apparatus of claim 1, wherein the anode p-type thermoelectric device and the cathode p-type thermoelectric device each comprise an array of thermoelectric elements, the thermoelectric elements of the array thermoelectric elements having a common polarity.

3. The apparatus of claim 2, wherein the anode p-type thermoelectric device and the cathode p-type thermoelectric device each comprise an array of thermoelectric elements, each thermoelectric element of the array of thermoelectric elements being a p-type polarity only.

4. The apparatus of claim 1, wherein an electric current passing through the cell also passes through the cathode p-type thermoelectric device, causing a cathode thermoelectric device voltage drop, and through the anode p-type thermoelectric device, causing an anode thermoelectric device voltage drop.

5. The apparatus of claim 1, further comprising a cathode heat sink, the cathode heat sink being physically coupled to the cathode p-type thermoelectric device.

6. The apparatus of claim 1, further comprising an anode heat sink, the anode heat sink being physically coupled to the anode p-type thermoelectric device.

7. The apparatus of claim 1, further comprising:
a second cell, the second cell comprising a second anode and a second cathode; and
a second anode p-type thermoelectric device electrically coupled to the second anode of the second cell, the second anode p-type thermoelectric device being connected in electrical series with the second anode of the second cell;
wherein the anode p-type thermoelectric device is electrically coupled to the second cathode of the second cell, the anode p-type thermoelectric device being connected in electrical series with the second cathode of the second cell.

8. The apparatus of claim 1, further comprising:
a plurality of cells connected in electrical series, the plurality of cells comprising the cell and a second cell, the cell being disposed at a cathode end of the plurality of cells and the second cell being disposed at an anode end of the plurality of cells, the second cell comprising a second anode and a second cathode;
a second anode p-type thermoelectric device electrically coupled to the second anode of the second cell, the second anode p-type thermoelectric device being connected in electrical series with the second anode of the second cell;
a cathode battery heat sink physically coupled to the cathode p-type thermoelectric device; and
an anode battery heat sink physically coupled to the second anode p-type thermoelectric device.

9. The apparatus of claim 8 further comprising a cathode battery fan and an anode battery fan, the cathode battery fan being physically coupled to the cathode battery heat sink and the anode battery fan being physically coupled to the anode battery heat sink.

10. The apparatus of claim 1, wherein the cathode p-type thermoelectric device is formed on the cathode out of a thin-film thermoelectric material and the anode p-type thermoelectric device is formed on the anode out of a thin-film thermoelectric material.

11. A Lithium ion cell for a battery, the cell comprising:
a casing;
an anode disposed within the casing;
a cathode disposed within the casing;
a Lithium ion source material;
an electrolyte disposed within the casing, the electrolyte operating as a Lithium ion carrier between the anode and the cathode;
a separator disposed within the casing, the separator being formed of a porous material that permits passage of ions between the anode to the cathode;
an anode p-type thermoelectric device disposed within the casing and electrically coupled to the anode, the anode p-type thermoelectric device being connected in electrical series with the anode such that an electric current that passes through the anode also passes through the anode p-type thermoelectric device, the anode p-type thermoelectric device comprising an anode plurality of p-type thermoelectric semiconductor elements electrically and thermally connected in parallel within the anode thermoelectric device such that the electric current that passes through the anode p-type thermoelectric device passes through the anode plurality of p-type thermoelectric semiconductor elements;
a cathode p-type thermoelectric device disposed within the casing and electrically coupled to the cathode, the cathode p-type thermoelectric device being connected in electrical series with the cathode such that an electric current that passes through the cathode also passes through the cathode p-type thermoelectric device, the cathode p-type thermoelectric device comprising a cathode plurality of p-type thermoelectric semiconductor elements electrically and thermally connected in parallel within the cathode p-type thermoelectric device such that the electric current that passes through the cathode p-type thermoelectric device passes through the cathode plurality of p-type thermoelectric semiconductor elements;

a negative terminal connected in electrical series with the anode p-type thermoelectric device, the negative terminal including a negative terminal portion that is external to the casing; and a positive terminal connected in electrical series with the cathode p-type thermoelectric device, the positive terminal including a positive terminal portion that is external to the casing;

wherein, when the cell is discharging and an electric discharge current is leaving the cathode and entering the anode, the cathode p-type thermoelectric device removes heat from the cathode due to a direction of the electric discharge current causing a side of the cathode p-type thermoelectric device physically coupled to the cathode to be a cold side and the anode p-type thermoelectric device provides heat to the anode due to the direction of the electric discharge current causing a side of the anode p-type thermoelectric device physically coupled to the anode to be a hot side; and wherein, when the cell is charging and an electric charge current is leaving the anode and entering the cathode, the anode p-type thermoelectric device removes heat from the anode due to a direction of the electric charge current causing the side of the anode p-type thermoelectric device physically coupled to the anode to be a cold side and the cathode p-type thermoelectric device provides heat to the cathode due to the direction of the electric charge current causing the side of the cathode p-type thermoelectric device physically coupled to the cathode to be a hot side.

12. The cell of claim 11, wherein
the anode is disposed in an anode plane,
the cathode is disposed in a cathode plane, and
the anode plane is substantially parallel to the cathode plane.

13. The cell of claim 11, wherein the anode, the cathode, and the separator are formed as sheets that are spirally wrapped.

14. The cell of claim 13, wherein the cathode p-type thermoelectric device is physically coupled to the cathode and wrapped with the cathode; and wherein the anode p-type thermoelectric device is physically coupled to the anode and wrapped with the anode.

15. An apparatus comprising:
a cell of a battery, the cell comprising an anode, a cathode, and a Lithium ion source material, the Lithium ion source material being a source for Lithium ions that travel between the anode and the cathode during operation of the cell;

an anode p-type thermoelectric device coupled to the anode in electrical series such that an electric current that passes through the anode also passes through the anode p-type thermoelectric device, the anode p-type thermoelectric device comprising an anode plurality of p-type thermoelectric semiconductor elements electrically and thermally connected in parallel within the anode p-type thermoelectric device such that the electric current that passes through the anode p-type thermoelectric device passes through the anode plurality of p-type thermoelectric semiconductor elements; and a cathode p-type thermoelectric device coupled to the cathode in electrical series such that an electric current that passes through the cathode also passes through the cathode p-type thermoelectric device, the cathode p-type thermoelectric device comprising a cathode plurality of p-type thermoelectric semiconductor elements electrically and thermally connected in parallel within the cathode p-type thermoelectric device such that the electric current that passes through the cathode p-type thermoelectric device passes through the cathode plurality of p-type thermoelectric semiconductor elements.

16. The apparatus of claim 15, wherein the anode p-type thermoelectric device and the cathode p-type thermoelectric device are formed via a thin-film deposition process.

17. The apparatus of claim 16, wherein a material used in the thin-film deposition process includes a superlattice.

18. The apparatus of claim 17, wherein the superlattice comprises a controlled hierarchical engineered superlattice structure (CHESS).

19. The apparatus of claim 16, wherein the thin-film deposition process is metal-organic chemical vapour deposition (MOCVD) or molecular beam epitaxy (MBE).

20. The apparatus of claim 15, wherein the anode p-type thermoelectric device and the cathode p-type thermoelectric device operate as a heat pump configured to remove heat from the anode or the cathode or provide heat to the anode or the cathode, based on a direction of current within the cell.

* * * * *